(12) United States Patent
Tamura

(10) Patent No.: US 10,510,574 B2
(45) Date of Patent: Dec. 17, 2019

(54) PROBER

(71) Applicant: Tokyo Seimitsu Co., Ltd., Tokyo (JP)

(72) Inventor: Hiroo Tamura, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 16/132,278

(22) Filed: Sep. 14, 2018

(65) Prior Publication Data

US 2019/0019711 A1 Jan. 17, 2019

Related U.S. Application Data

(63) Continuation of application No. PCT/JP2016/060790, filed on Mar. 31, 2016.

(30) Foreign Application Priority Data

Mar. 18, 2016 (JP) ................. 2016-055901

(51) Int. Cl.
*H01L 21/68* (2006.01)
*G01R 1/073* (2006.01)
(Continued)

(52) U.S. Cl.
CPC .......... *H01L 21/68* (2013.01); *G01R 1/07307* (2013.01); *G01R 31/2868* (2013.01);
(Continued)

(58) Field of Classification Search
CPC ... H01L 21/68; H01L 21/67763; H01L 22/12; H01L 22/20; H01L 22/34; G01R 1/07307; G01R 31/2887
See application file for complete search history.

(56) References Cited

U.S. PATENT DOCUMENTS 5,912,555 A 6/1999 Akaike et al.
2011/0298630 A1 12/2011 Kiyokawa et al.
(Continued)

FOREIGN PATENT DOCUMENTS

CN 104764986 A 7/2015
JP H01-206270 A 8/1989
(Continued)

OTHER PUBLICATIONS

Tokyo Seimitsu Co. Ltd., International Preliminary Report on Patentability, PCTJP2016060790, dated Jun. 13, 2017, 8 pgs.
(Continued)

*Primary Examiner* — Melissa J Koval
*Assistant Examiner* — Courtney G McDonnough
(74) *Attorney, Agent, or Firm* — Morgan, Lewis & Bockius LLP

(57) ABSTRACT

Abbe error that needs to be considered in high accuracy positioning of a device to be maintained, is suppressed. A prober includes: a plurality of measurement sections arranged between a conveyance area and a maintenance area, each of the measurement sections having a device to be maintained which is used for inspection of a semiconductor element formed on a wafer, and a draw-out mechanism configured to draw out the device to be maintained to a side of the maintenance area; a conveyance unit configured to convey an object to be conveyed to a destination measurement section; and a loading part configured to load the object to be conveyed from the side of the maintenance area to the measurement section. The object to be conveyed is loadable into the measurement section from a conveyance area side and the maintenance area side.

10 Claims, 16 Drawing Sheets

(51) Int. Cl.
  *H01L 21/677* (2006.01)
  *H01L 21/66* (2006.01)
  *G01R 31/28* (2006.01)

(52) U.S. Cl.
  CPC .... *G01R 31/2893* (2013.01); *H01L 21/67763* (2013.01); *H01L 22/12* (2013.01); *H01L 22/20* (2013.01); *H01L 22/34* (2013.01); *G01R 31/2887* (2013.01)

(56) References Cited

U.S. PATENT DOCUMENTS

| | | | | |
|---|---|---|---|---|
| 2015/0192607 | A1* | 7/2015 | Amemiya | G01R 31/2601 324/756.03 |
| 2016/0329974 | A1* | 11/2016 | Oneil | H04B 17/0085 |

FOREIGN PATENT DOCUMENTS

| | | |
|---|---|---|
| JP | H07-058168 A | 3/1995 |
| JP | H08-288341 A | 11/1996 |
| JP | 2000-124274 A | 4/2000 |
| JP | 2000-150596 A | 5/2000 |
| JP | 2002-158266 A | 5/2002 |
| JP | 2009-277773 A | 11/2009 |
| JP | 2010-080775 A | 4/2010 |
| JP | 2014-150168 A | 8/2014 |
| JP | 2014-179379 A | 9/2014 |
| JP | 2015-130422 A | 7/2015 |
| KR | 20150083038 A | 7/2015 |
| WO | WO2011-016096 A1 | 2/2011 |

OTHER PUBLICATIONS

Tokyo Seimitsu Co. Ltd., Notification of Reasons for Refusal, JP2016-055902, dated Apr. 22, 2016, 4 pgs.
Tokyo Seimitsu Co. Ltd., Notification of Reasons for Refusal, JP2016-131377, dated Jul. 14, 2016, 4 pgs.
Tokyo Seimitsu Co. Ltd., Notification of Reasons for Refusal, JP2016-184640, dated Oct. 17, 2016, 5 pgs.
Tokyo Seimitsu Co. Ltd., Notification of Reasons for Refusal, JP2016-055901, dated Sep. 11, 2018, 6 pgs.
Tokyo Seimitsu Co. Ltd., Decision to Grant a Patent, JP2016-055901, dated Nov. 2, 2018, 6 pgs.

* cited by examiner

PROBER

CROSS-REFERENCE TO RELATED APPLICATIONS

This application is a Continuation of PCT International Application No. PCT/JP2016/060790 filed on Mar. 31, 2016, which claims priority under 35 U.S.C. § 119(a) to Japanese Patent Application No. 2016-055901 filed on Mar. 18, 2016. Each of the above applications is hereby expressly incorporated by reference, in their entirety, into the present application.

BACKGROUND OF THE INVENTION

1. Field of the Invention

The present invention relates to a prober that tests electric characteristics of multiple semiconductor elements (chips) formed on a semiconductor wafer, and particularly to a prober that includes a draw-out mechanism for drawing out a device to be maintained to the maintenance area side.

2. Description of the Related Art

A conventionally proposed prober (wafer inspection system) includes a plurality of measurement sections (cells), a conveyance mechanism (loader) that conveys objects to be conveyed (wafers) to the measurement sections, and a draw-out mechanism (moving mechanism) that draws out a pogo frame (device to be maintained) in the side direction (see Japanese Patent Application Laid-Open No. 2014-179379 (PTL 1), for example). The prober described in PTL 1 is configured such that, in a state where the test head which is arranged above the pogo frame is moved upward by the moving mechanism so that the test head is separated from the pogo frame, the pogo frame is drawn out in the side direction. Hence, it is possible to prevent breakage or the like of a pogo pin of the pogo frame due to interference between the pogo pin and the test head, when the pogo frame is drawn out in the side direction.

CITATION LIST

Patent Literature

PTL 1: Japanese Patent Application Laid-Open No. 2014-179379

SUMMARY OF THE INVENTION

However, the prober described in PTL 1 does not suggest any suitable relationship between the draw-out direction of the device to be maintained and the conveying direction of the object to be conveyed.

The present invention has been made in view of the foregoing, and aims to suppresses (or eliminates) Abbe error that needs to be considered in high accuracy positioning of the device to be maintained, for a prober including: a plurality of measurement sections each of which has the device to be maintained and a draw-out mechanism configured to draw out the device to be maintained; and a conveyance unit that moves to a position accessible to a measurement section as a destination of an object to be conveyed and conveys the object to be conveyed to the destination measurement section. The present invention also aims to provide a prober that enables efficient inspection, in which the object to be conveyed can be loaded into the measurement section from both sides, and the loading direction of the object to be conveyed into the measurement section can be switched according to the operation state of the measurement section or the object to be conveyed.

To achieve the above objective, a prober of the present invention includes: a plurality of measurement sections arranged between a conveyance area and a maintenance area, and having a device to be maintained used for inspection of a semiconductor element formed on a wafer, and a draw-out mechanism that draws out the device to be maintained to a side of the maintenance area (maintenance area side); a conveyance unit that includes a case housing an object to be conveyed, and moves to a position in the conveyance area accessible to a measurement section being a conveyance destination of the object to be conveyed, to convey and load the object to be conveyed into the destination measurement section; and a loading part that loads the object to be conveyed from the side of the maintenance area into the measurement section. A draw-out direction of the device to be maintained and a conveyance direction of the object to be conveyed are on a straight line, and the object to be conveyed is loadable into the measurement section from a side of the conveyance area (conveyance area side) and the maintenance area side.

According to this aspect, since the draw-out direction of the device to be maintained and the conveyance direction of the object to be conveyed are on a straight line, Abbe error that needs to be considered in positioning of the device to be maintained, can be suppressed.

Also, according to this aspect, since the object to be conveyed is loadable to the measurement section from the conveyance area side and the maintenance area side, a more efficient inspection can be performed by changing the side from which to load the object to be conveyed into the measurement section according to the operation state of the measurement section or the object to be conveyed.

In an aspect of the prober of the present invention, the conveyance unit loads the object to be conveyed into the measurement section if the object to be conveyed is used for inspection of the semiconductor element, and the loading part loads the object to be conveyed into the measurement section if the object to be conveyed is used for calibration of a position of the measurement section.

According to this aspect, the conveyance unit loads (loads from conveyance area side) the object to be conveyed into the measurement section if the object to be conveyed is used for inspection of the semiconductor element, and the loading part loads (loads from maintenance area side) the object to be conveyed into the measurement section if the object to be conveyed is used for calibration of a position of the measurement section. Hence, the direction in which to load the object to be conveyed into the measurement section can be determined depending on whether the object is for inspection or for calibration, and efficient inspection can be performed.

In an aspect of the prober of the present invention, the conveyance unit loads the object to be conveyed if the object to be conveyed requires adjustment of environment and the loading part loads the object to be conveyed if the object to be conveyed does not require adjustment of environment.

According to this aspect, the conveyance unit loads (loads from conveyance area side) the object to be conveyed if the object to be conveyed requires adjustment of environment and the loading part loads (loads from maintenance area side) the object to be conveyed if the object to be conveyed does not require adjustment of environment. Hence, the direction in which to load the object to be conveyed into the measurement section can be determined depending on whether or not adjustment of environment is required, and efficient inspection can be performed.

In an aspect of the prober of the present invention, the object to be conveyed that the loading part loads into the measurement section is a calibration probe card.

According to this aspect, since the calibration probe card is loaded into the measurement section by the loading part, calibration of the measurement section can be performed efficiently.

In an aspect of the prober of the present invention, the object to be conveyed that the conveyance unit loads into the measurement section is a measuring probe card.

According to this aspect, since the measuring probe card is loaded into the measurement section by the conveyance unit, measurement of the measurement section can be performed efficiently.

According to the present invention, for a prober including: a plurality of measurement sections having a device to be maintained and a draw-out mechanism that draws out the device to be maintained; and a conveyance unit that moves to a position accessible to a measurement section as a destination of an object to be conveyed and conveys the object to be conveyed into the destination measurement section, in high accuracy positioning of the device to be maintained, Abbe error that needs to be considered is suppressed (or eliminated).

DESCRIPTION OF EMBODIMENTS

Hereinafter, a preferred embodiment of the present invention will be described with reference to the accompanying drawings.

Figure 1:
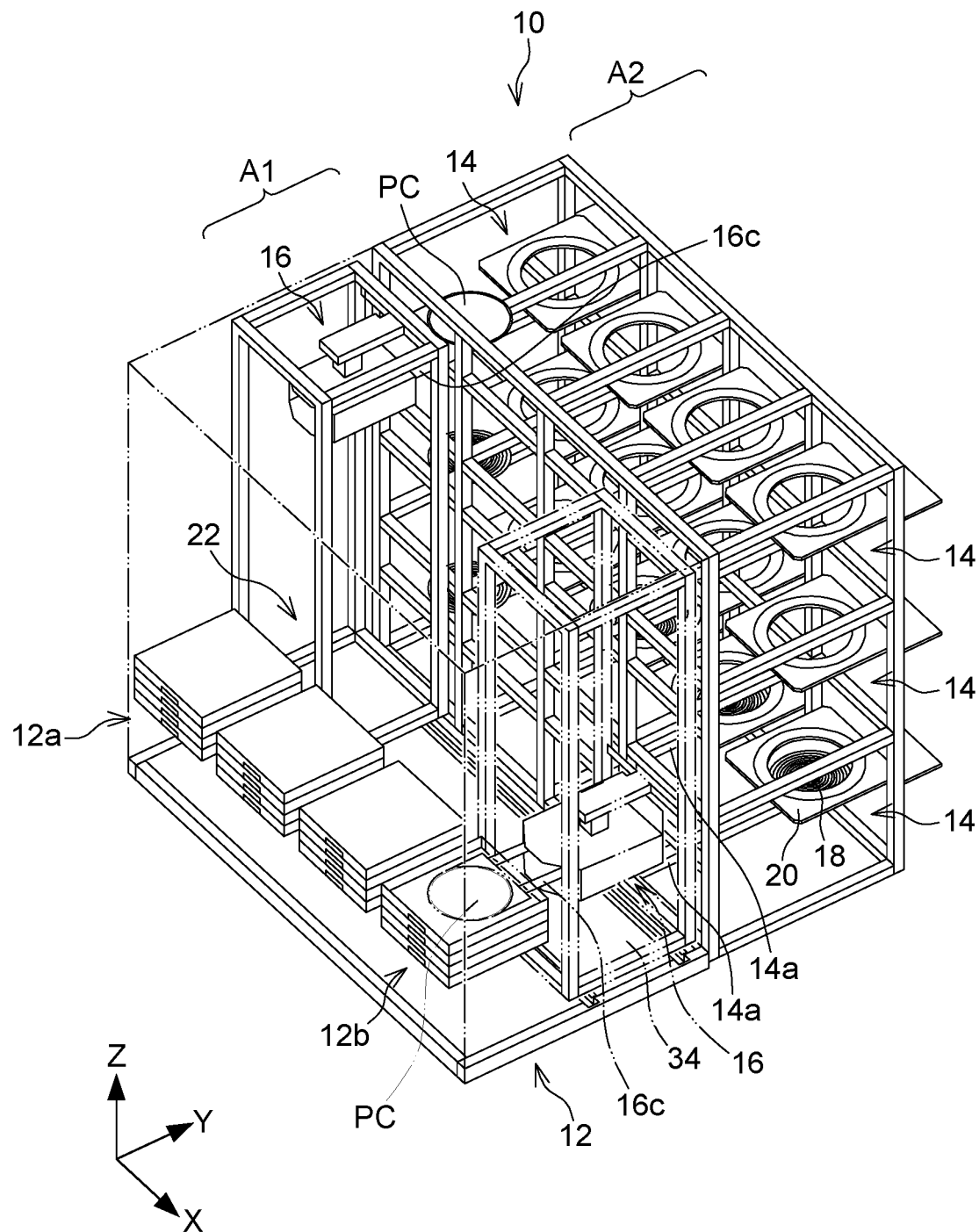
FIG. 1 is a perspective view of a schematic configuration of a prober of the embodiment.

FIG. 1 is a perspective view of a schematic configuration of a prober 10 of the embodiment.

As illustrated in FIG. 1, the prober 10 of the embodiment includes: an object storage section 12; a plurality of measurement sections 14; a conveyance unit 16 that moves between the object storage section 12 and each measurement section 14 to convey an object to be conveyed (at least one of a wafer and a probe card in the embodiment) into the object storage section 12 or each measurement section 14; and a moving device 22 that moves the conveyance unit 16 between the object storage section 12 and each measurement section 14.

The object storage section 12 and each measurement section 14 are spaced apart by a predetermined distance in direction Y, and arranged so that their faces on sides accessed by the conveyance unit 16 facing each other (i.e., placed face-to-face).

The conveyance unit 16 is arranged between the object storage section 12 and the measurement sections 14.

The object storage section 12 has a wafer storage section 12a storing a plurality of wafers, and a probe card storage section 12b storing a plurality of probe cards. The number and arrangement of the object storage sections 12 are not particularly limited. In the embodiment, four object storage sections 12 including the wafer storage sections 12a and the probe card storage sections 12b are placed horizontally (X-axis direction) in a state where their faces (faces on the right side in FIG. 1) on the side accessed by the conveyance unit 16 face the same direction. Note that the opposite side (left side in FIG. 1) of the side accessed by the conveyance unit 16 is accessed by a worker when collecting the wafers or the probe cards.

Figure 8:
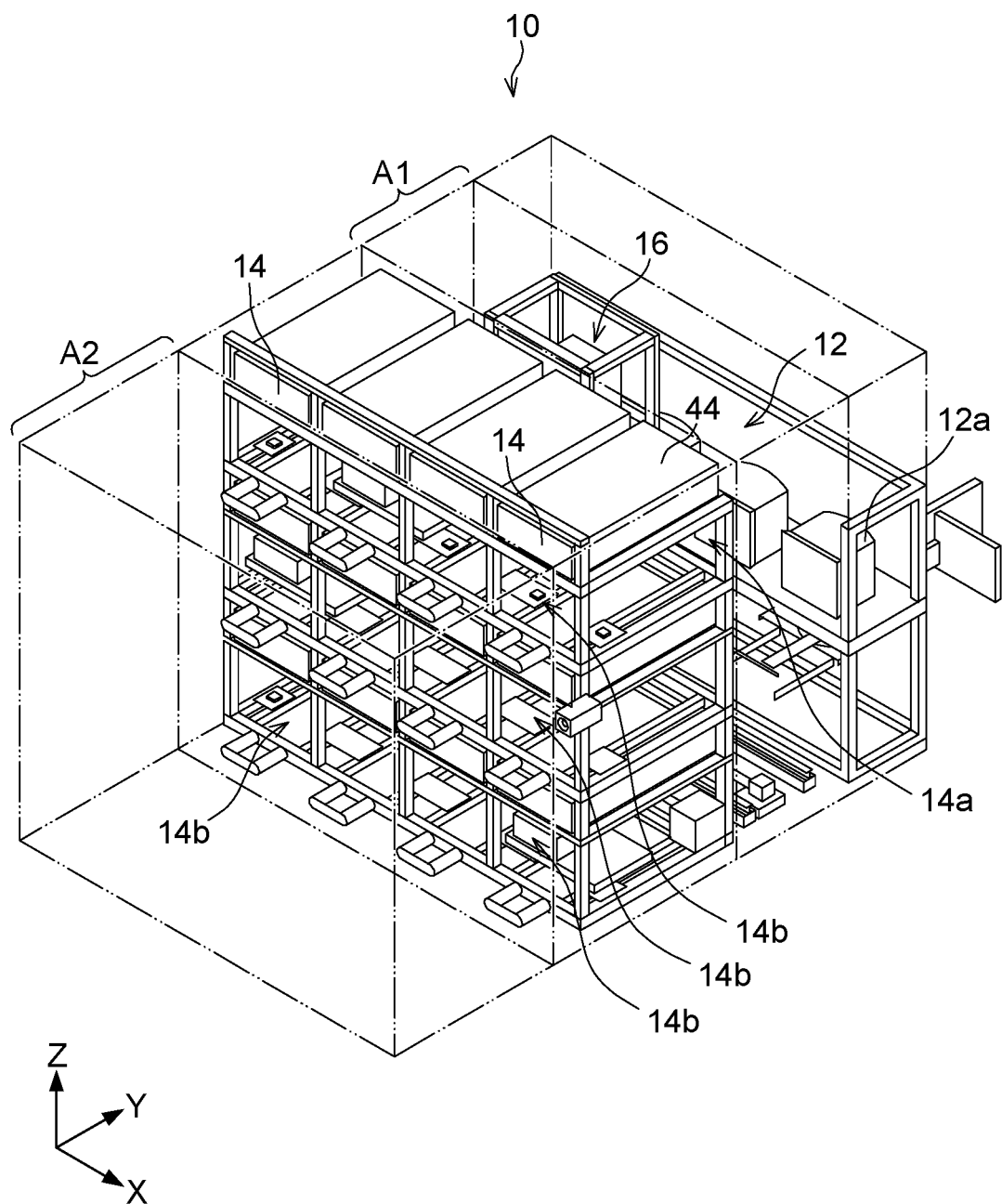
FIG. 8 is a perspective view illustrating a schematic configuration of the prober.
Figure 9:
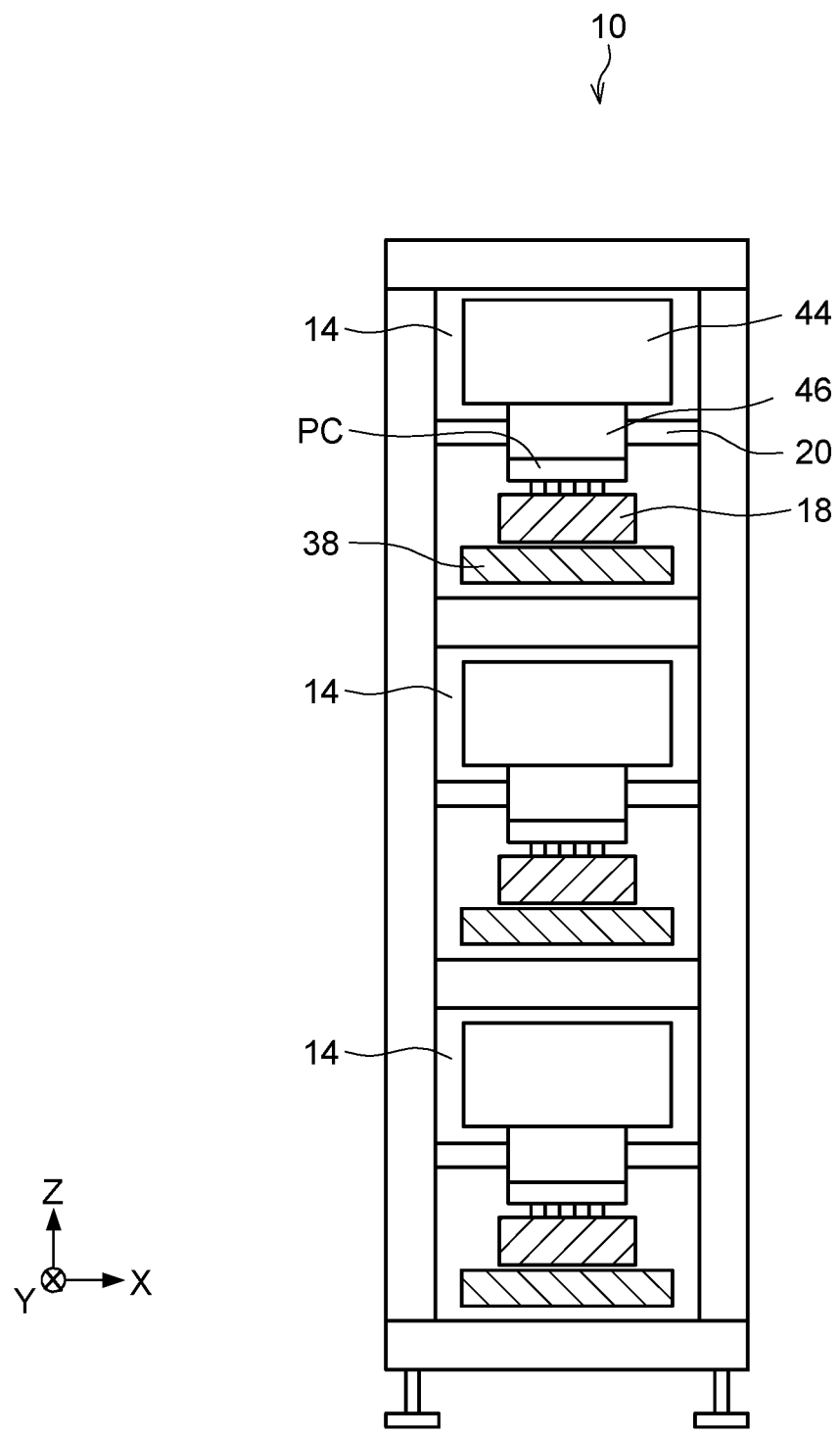
FIG. 9 is a front view of the measurement sections (one column).
Figure 10:
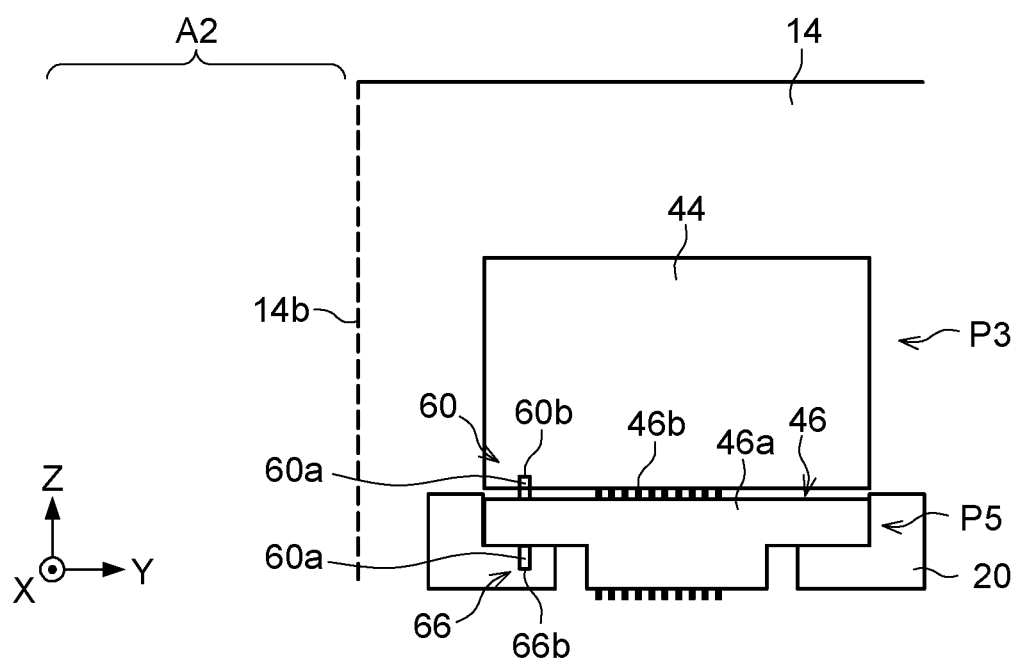
FIG. 10 is a schematic diagram illustrating a positional relationship among a head stage, a pogo frame, and a test head.
Figure 11:
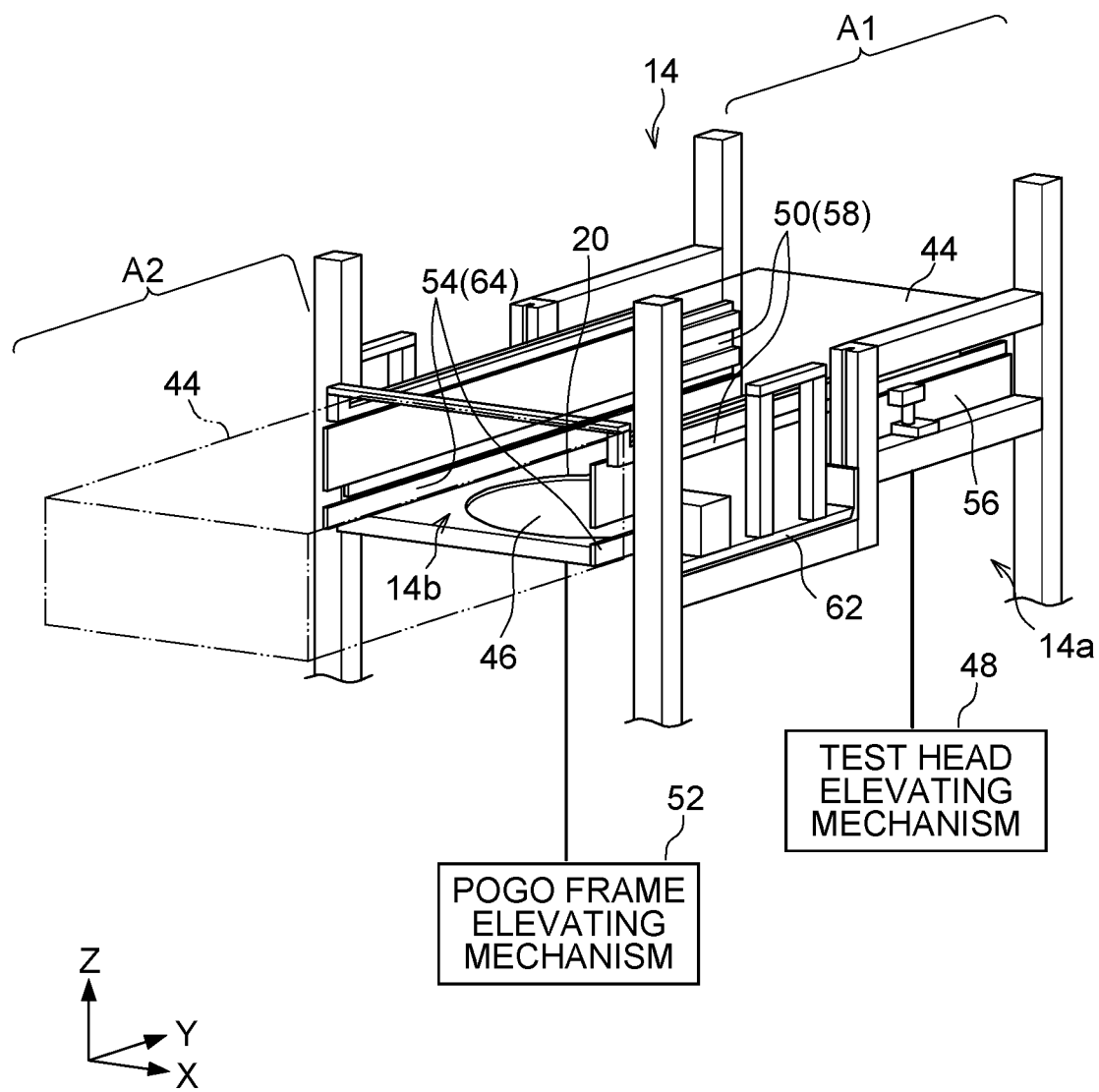
FIG. 11 is an enlarged partial perspective view of the measurement section.

As illustrated in FIG. 8, the plurality of measurement sections 14 are arranged between a conveyance area A1 and a maintenance area A2. As illustrated in FIG. 1, each of the plurality of measurement sections 14 is a rectangular parallelepiped measurement room (also referred to as a prober room) configured by combining a plurality of frames extending in the X-axis direction, a plurality of frames extending in the Y-axis direction, and a plurality of frames extending in the Z-axis direction. As illustrated in FIGS. 9 and 10, a wafer chuck 18 that holds a wafer, a head stage 20, a test head 44 placed on the head stage 20, a pogo frame 46 arranged between the head stage 20 and the test head 44, and a first probe card holding mechanism (probe card holding part) 36 (omitted from FIGS. 9 and 10) that holds a probe card PC are arranged inside each of the plurality of measurement sections 14. Additionally, as illustrated in FIG. 11, a test head elevating mechanism 48, a test head draw-out mechanism 50, a pogo frame elevating mechanism 52, and a pogo frame draw-out mechanism 54 are arranged inside each of the measurement sections 14.

Figure 2:
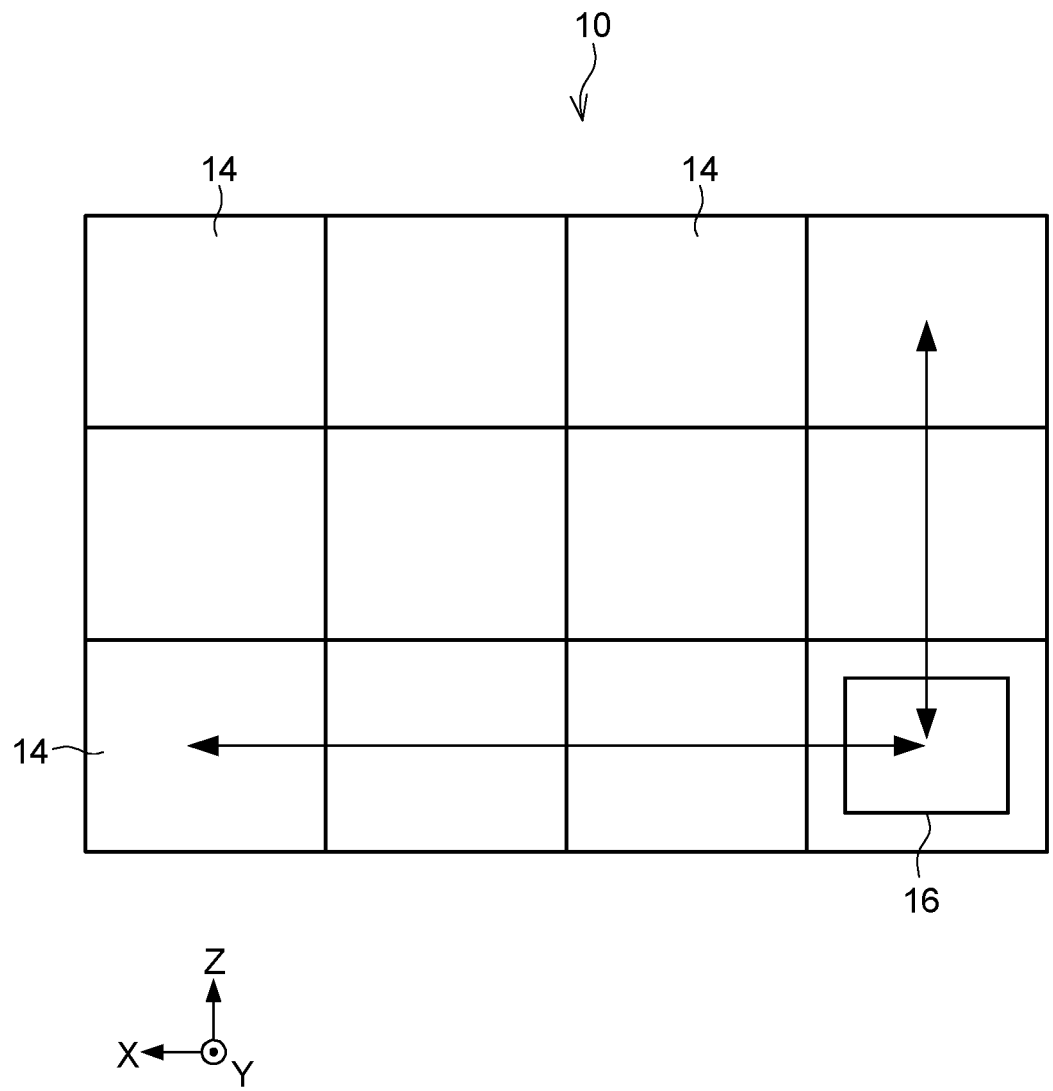
FIG. 2 is a front view of measurement sections.

FIG. 2 is a front view of the measurement sections 14.

Although the number and arrangement of the measurement sections 14 are not particularly limited, in the embodiment, as illustrated in FIGS. 1 and 2, three layers of measurement section groups, in each of which four measurement sections 14 are horizontally (X-axis direction) arranged, are stacked on top of one another in the vertical direction (Z-axis direction). In addition, the three measurement section group are arranged two-dimensionally so that faces (faces on the left side in FIG. 1) on the side accessed by the conveyance unit 16 face the same direction.

Each measurement section 14 (the face on the side accessed by the conveyance unit 16) has an opening 14a through which a wafer holding arm 16b (wafer arm: object to be conveyed holding arm) and a probe card holding arm 16c (probe card arm) of the conveyance unit 16 move in and out. Meanwhile, the measurement section 14 has an opening 14b (see FIG. 8) through which the test head 44 and the pogo frame 46 are drawn out, on the opposite side of the side where the opening 14a is formed. Faces of the measurement section 14 other than the faces having openings 14a and 14b may be closed or have an opening.

The temperature of the wafer chuck 18 is adjusted to a high or low target temperature (inspection temperature) by a known temperature control device (e.g., a heat plate, a chiller, or the like built into the wafer chuck 18).

The environment inside each measurement section 14 is adjusted in the following manner. For example, the temperature inside each measurement section 14 is adjusted to a target temperature (inspection temperature) according to the temperature of the wafer chuck 18 placed inside the measurement section 14. The humidity inside each measurement section 14 is adjusted to a target humidity, by purging the inside of each measurement section 14 with dry air by use of a known mechanism. The environment inside each measurement section 14 is adjusted by purging the inside of the measurement section 14 with a certain gas (e.g., nitrogen gas) by use of a known mechanism. Multiple types of tests including a later-mentioned high temperature test, low temperature test, and test under a certain gas (e.g., nitrogen gas) atmosphere are performed in each measurement section 14. The environment inside each measurement section 14 is adjusted, so that the environment inside each measurement section 14 changes to an environment corresponding to the test performed in the measurement section 14. Note that the tests performed in the measurement sections 14 may be the same, or may vary among the measurement sections.

The first probe card holding mechanism 36 is means for detachably holding the probe card PC, and is provided above the wafer chuck 18, for example, on the head stage 20 side. The first probe card holding mechanism 36 detachably holds the probe card PC conveyed to the first probe card holding mechanism 36 by a later-mentioned probe card conveyance mechanism. The first probe card holding mechanism 36 is a known technique (see Japanese Patent Application Laid-Open No. 2000-150596, for example), and therefore further descriptions will be omitted.

Each measurement section group has an alignment device 38 that performs relative positioning between the probe card PC held by the first probe card holding mechanism 36 and the wafer held by the wafer chuck 18, and a moving device (not shown) that moves the alignment device 38 among the four measurement sections 14. The alignment device 38 is moved among four measurement sections 14 included in the measurement section group in which the alignment device 38 is placed, and is shared among the four measurement sections 14. A technique described in Japanese Patent Application Laid-Open No. 2014-150168, for example, may be applied as the moving device that moves the alignment device 38 among the four measurement sections 14.

The alignment device 38 is means for performing relative positioning between the probe card PC held by the first probe card holding mechanism 36 and the wafer held by the wafer chuck 18. The alignment device 38 includes moving and rotation mechanisms for moving the wafer chuck 18 in X-Y-Z-θ directions, such as a Z-axis movable portion 38a elevated and lowered in the Z-axis direction, a Z-axis fixed portion 38b, and an XY movable portion 38c. The alignment device 38 is mainly used for moving in X-Y-Z-θ directions while aligning a wafer W held by the wafer chuck 18 with a probe of the probe card PC held above the wafer chuck 18 by a known method, bringing the wafer W and the probe into electrical contact and inspecting electrical characteristics of the wafer W through the test head.

Inside the measurement section 14, the alignment device 38 moves between a probe card receiving position P1 (see FIG. 7A) in the vicinity of the opening 14a and a position P2 (see FIG. 7B) below the first probe card holding mechanism 36 while holding the wafer chuck 18. In other words, in a destination measurement section 14, the alignment device 38 moves between the conveyance area A1 side and the maintenance area A2 side. The movement can be achieved by a known alignment device moving device (moving device for the alignment device) (not shown).

When receiving the probe card PC, the alignment device moving device moves the alignment device 38 which is holding the wafer chuck 18 heated to the target temperature to the probe card receiving position P1. When conveying the probe card PC to the first probe card holding mechanism 36, the alignment device moving device moves the alignment device 38 which is holding the probe card PC and the wafer chuck 18 heated to the target temperature, to the position P2.

The alignment device 38 includes a second probe card holding mechanism 40 (also referred to as a card lifter).

The second probe card holding mechanism 40 is means for receiving the probe card PC from the probe card holding arm 16c and holding the probe card PC. For example, the second probe card holding mechanism 40 includes a holding portion 40a (e.g., a ring-like member or multiple pins) that is attached to the Z-axis movable portion 38a so as to surround the wafer chuck 18, and an elevating mechanism (not shown) that elevates and lowers the holding portion 40a relative to the Z-axis movable portion 38a in the Z-axis direction.

Reception and holding of the probe card PC are achieved by, in a state where the alignment device 38 is moved to the probe card receiving position P1, elevating the holding portion 40a relative to the Z-axis movable portion 38a in the Z-axis direction to bring the holding portion 40a into contact with the probe card PC (lower face outer edge), and lifting the probe card PC from the probe card holding arm 16c by the holding portion 40a elevated in the Z-axis direction. The probe card PC is held directly above the wafer chuck 18.

The probe card conveyance mechanism is means for conveying the probe card PC held by the second probe card holding mechanism 40 to the first probe card holding mechanism 36. For example, the probe card conveyance mechanism includes the Z-axis movable portion 38a which is elevated and lowered in the Z-axis direction and provided in the alignment device 38.

Conveyance of the probe card PC to the first probe card holding mechanism 36 is achieved by elevating the Z-axis movable portion 38a in the Z-axis direction in a state where the alignment device 38 is moved to the position P2.

Figure 3A:
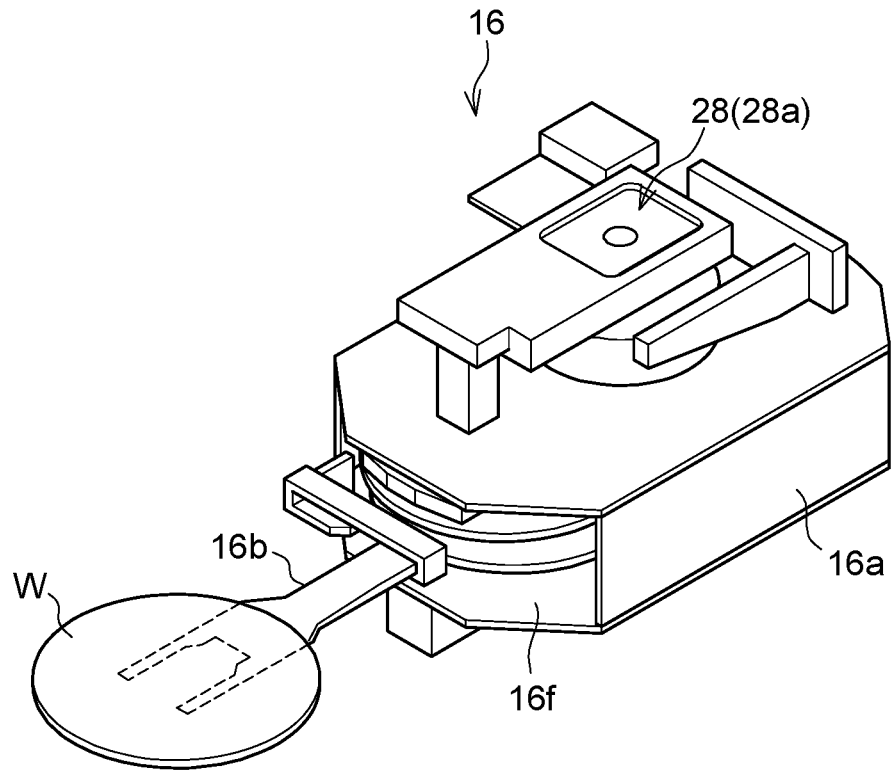
FIG. 3A is a perspective view of a conveyance unit.
Figure 3B:
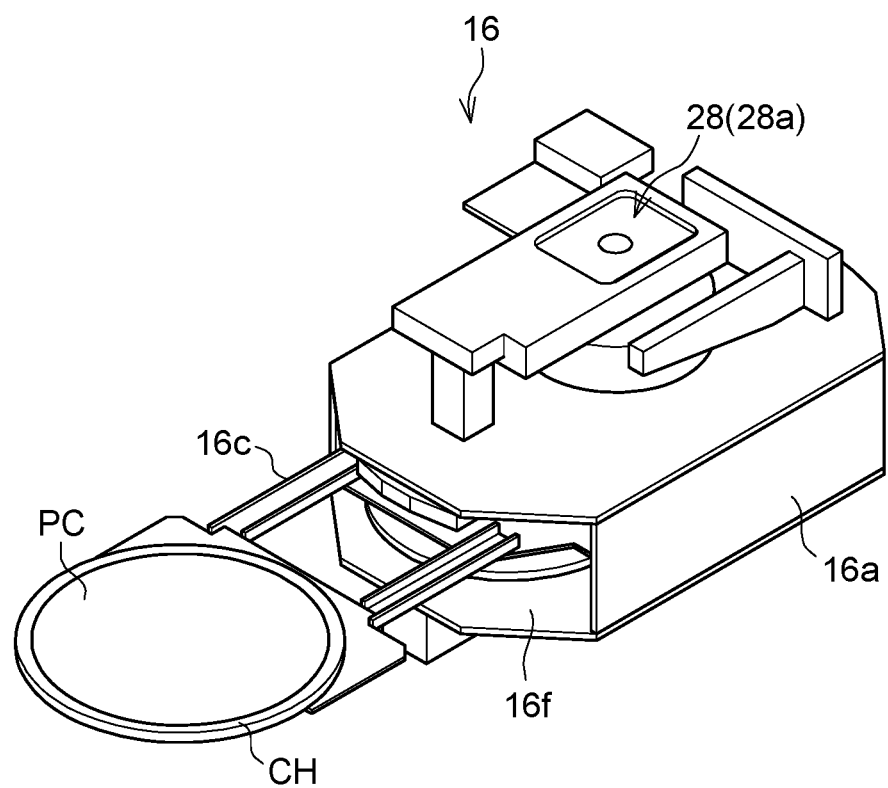
FIG. 3B is a perspective view of the conveyance unit.
Figure 4:
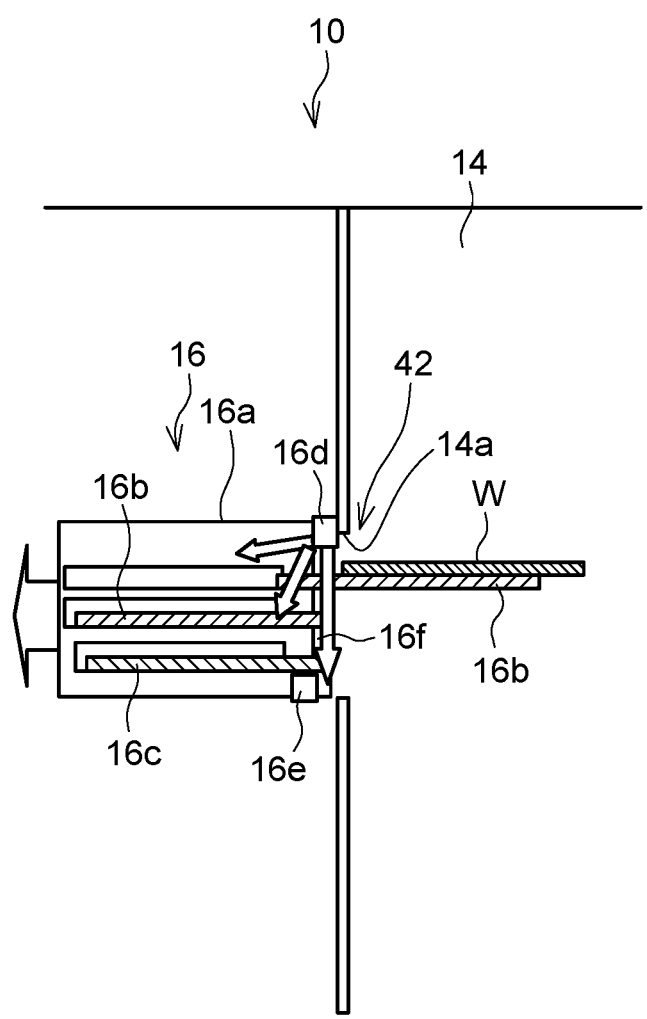
FIG. 4 is a longitudinal section illustrating a schematic configuration of the conveyance unit.

FIGS. 3A and 3B are perspective views of the conveyance unit 16, and FIG. 4 is a longitudinal section illustrating a schematic configuration of the conveyance unit 16.

The conveyance unit 16 moves in the X-axis direction and the Z-axis direction between the object storage section 12 and each measurement section 14. The conveyance unit 16 is means for conveying and loading the wafer W or the probe card PC into the object storage section 12 or each measurement section 14. As illustrated in FIGS. 3A, 3B, and 4, the conveyance unit 16 includes a case 16a which houses the wafer W and the probe card PC, and has an 16f for putting in and out the wafer W and the probe card PC (wafer holding arm 16b and probe card holding arm 16c). The case 16a has a rectangular parallelepiped shape. The wafer holding arm 16b, the probe card holding arm 16c, an arm moving mechanism (not shown) that individually moves the arms 16b and 16c, environment control means 16d that adjusts the environment inside the case 16a, and a sensor 16e that detects the environment inside the case 16a are arranged inside the case 16a. Although the number of the conveyance units 16 is not particularly limited, in the embodiment, one conveyance unit 16 is used. Although two conveyance units 16 are depicted in FIG. 1, this illustrates how one conveyance unit 16 accesses the object storage section 12 (probe card storage section 12b) (see the conveyance unit 16 depicted at the right lower side in FIG. 1), and accesses the measurement section 14 (see the conveyance unit 16 depicted on the left upper side in FIG. 1).

The wafer holding arm 16b is means for holding the wafer W, and is arranged inside the case 16a in such a manner as to be horizontally movable along a guide rail (not shown) provided inside the case 16a, for example. The wafer holding arm 16b and the wafer W are housed inside the case 16a in a state where the wafer holding arm 16b while holding the wafer W.

The probe card holding arm 16c is means for holding the probe card PC. The probe card holding arm 16c is arranged inside the case 16a in such a manner as to be horizontally movable along a guide rail (not shown) provided inside the case 16a, for example. The probe card holding arm 16c is housed inside the case 16a together with the probe card PC in a state where the probe card holing arm 16c holds the probe card PC. The probe card PC includes a card holder CH. The probe card PC may include a seal ring instead of the card holder CH.

Although the number and arrangement of the arms 16b and 16c are not particularly limited, in the embodiment, as illustrated in FIG. 4, two wafer holding arms 16b and one probe card holding arm 16c are arranged vertically in three layers. Additionally, after having conveyed the object to be conveyed to the measurement section 14, the conveyance unit 16 uses the arms 16b and 16c to load the object to be conveyed into the measurement section 14.

The arm moving mechanism is configured using a known mechanism such as a driving motor (not shown) provided in the case 16a. By rotating the driving motor in forward and reverse directions, the arms 16b and 16c reciprocate individually in the horizontal direction to move in and out through the opening 16f in the case 16a.

The conveyance unit 16 includes air curtain forming means 42.

The air curtain forming means 42 is means for forming an air curtain that closes the opening 16f formed in the case 16a to seal or substantially seal the space inside the case 16a. The air curtain forming means 42 is configured using a known air injection port, for example.

Although the number, shape, and arrangement of the air injection ports are not particularly limited, in the embodiment, as illustrated in FIG. 4, a plurality of air injection ports are oriented so as to inject air downward, and are arranged along the upper end edge of the opening 16f in the vicinity of the upper end edge (in a direction perpendicular to the paper surface of FIG. 4).

The environment inside the case 16a is adjusted as follows. For example, the temperature and humidity inside the case 16a are adjusted to a target temperature and humidity under a certain gas atmosphere, by purging the inside of each measurement section 14 with dry air (high temperature or low temperature dry air) or a certain gas (nitrogen gas). This is achieved by known environment control means 16d, such as a temperature-adjusted gas supply source including a heater and a cooling device (cooler), a fan, and piping connecting the fan (none of the parts are shown) and the case 16a. The environment control means 16d may include a dehumidifier. The gas (high temperature or low temperature dry air) having a temperature (and humidity) adjusted by the temperature-adjusted gas supply source is supplied into the case 16a through the piping by the fan, and is also injected from the air injection ports to form an air curtain that closes the opening 16f formed in the case 16a. This seals or substantially seals the space inside the case 16a. The supply source of gas supplied into the case 16a and the supply source of gas injected from the air injection port may be the same, or may be different. Faces of the case 16a other than the face having the opening 16f may be closed or have an opening. The environment control means 16d may be attached to the case 16a, or may be attached to the arms 16b and 16c.

The sensor 16e is a sensor that detects the environment inside the case 16a, and is a temperature sensor and a humidity sensor, for example. The sensor 16e may be included in the environment control means 16d.

The environment control means 16d adjusts the environment inside the case 16a, so that the environment changes to an environment corresponding to the environment at the destination of the object to be conveyed. Specifically, the environment control means 16d adjusts the environment inside of the case 16a to a target environment based on a detection result of the sensor 16e. For example, the environment control means 16d controls the temperature-adjusted gas supply source based on the detection result of the sensor 16e, so that the temperature and humidity inside the case 16a reach the target temperature and humidity. This function of the environment control means 16d is achieved by feedback control performed by a controller (not shown) to which the sensor 16e and the temperature-adjusted gas supply source (heater and cooling device) are electrically connected. Here, the environment control means 16d and the air curtain forming means 42 may be formed as one unit. That is, the same device may include a downward air injection port for closing the opening 16f and an air injection port of dry air for adjusting the environment inside the case 16a. Here, it is preferable that the air injection port of dry air for adjusting the environment inside the case 16a be oriented to enhance circulation of the injected dry air inside the case 16a. By forming the environment control means 16d and the air curtain forming means 42 as one unit, less space is required for the environment control means 16d and the air curtain forming means 42, and space inside the case 16a can be used efficiently. Additionally, by forming the environment control means 16d and the air curtain forming means 42 as one unit, a temperature-adjusted gas supply source including a heater and a cooling device (cooler), fan, and other components can be shared between the environment control means 16d and the air curtain forming means 42.

Figure 5:
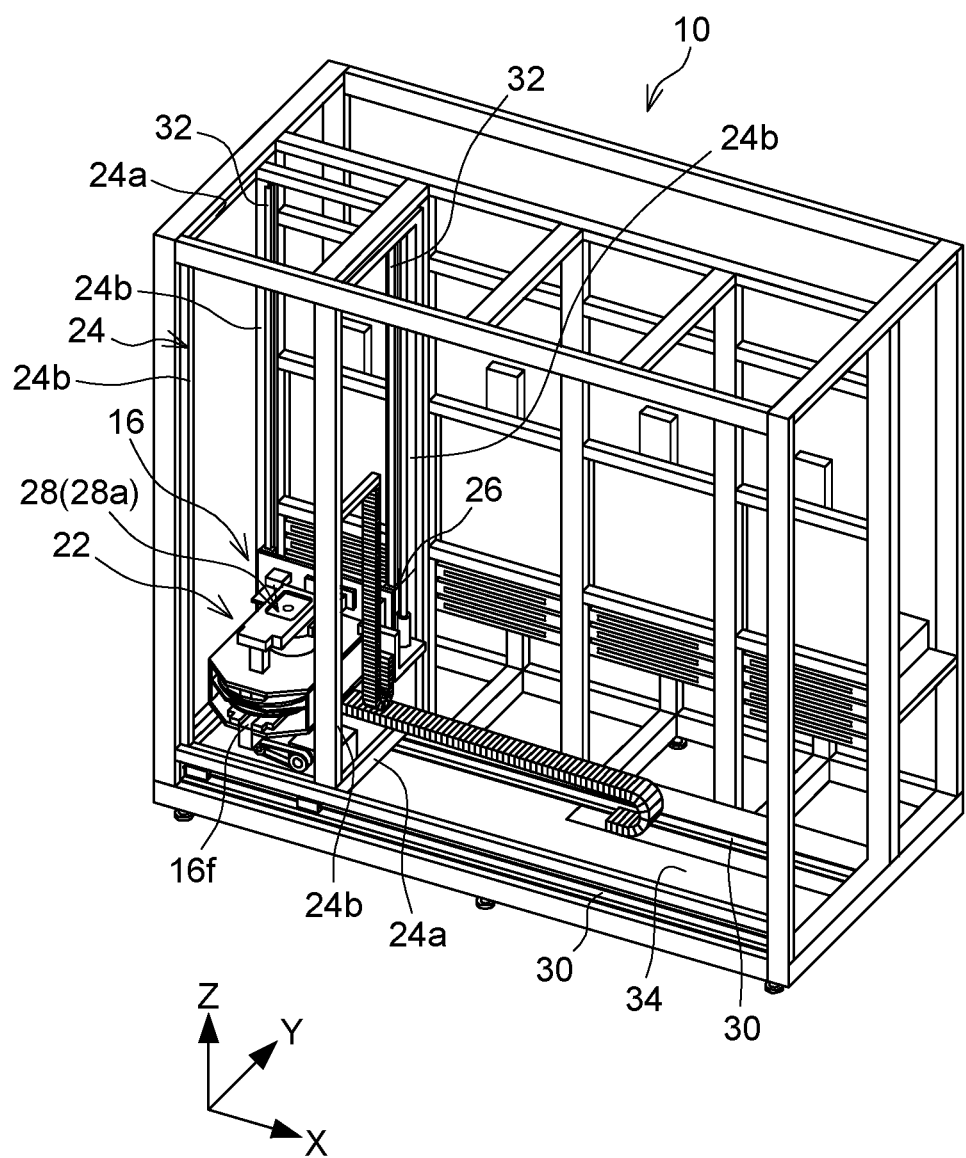
FIG. 5 is a perspective view of a moving device.
Figure 6:
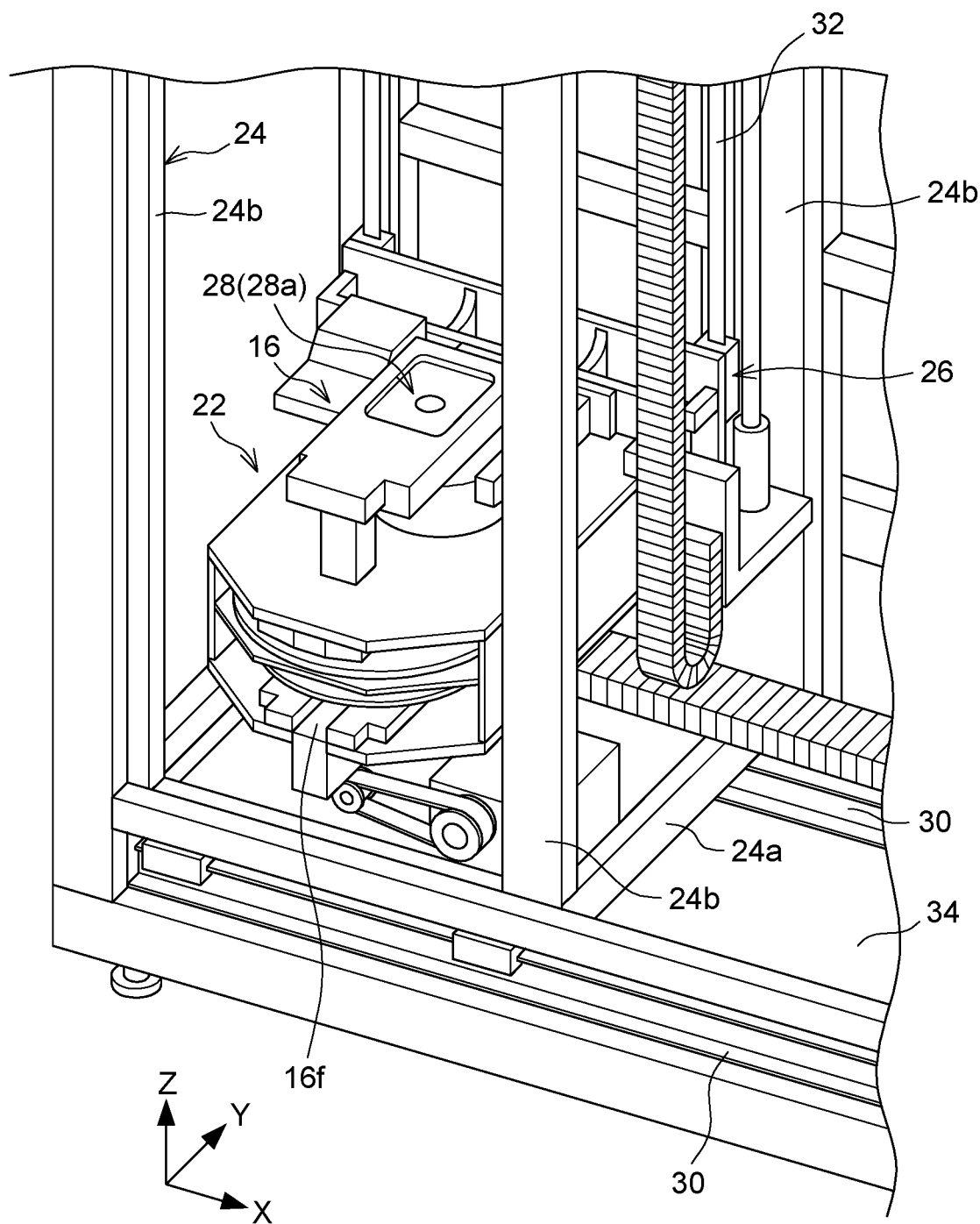
FIG. 6 is an enlarged partial perspective view of the moving device.

FIG. 5 is an enlarged partial perspective view of the moving device 22, and FIG. 6 is an enlarged partial perspective view of the moving device 22.

The moving device 22 is means for moving the conveyance unit 16 between the object storage section 12 and each measurement section 14 in the X-axis direction and the Z-axis direction. As illustrated in FIGS. 5 and 6, for example, the moving device 22 includes: a first movable body 24 that moves between the object storage section 12 and each measurement section 14 in the horizontal direction (X-axis direction) along which the measurement sections 14 are arranged; a first movable body moving mechanism (not shown) that moves the first movable body 24 in the horizontal direction (X-axis direction); a second movable body 26 that is attached to the first movable body 24 to be movable in the vertical direction (Z-axis direction) along which the measurement sections 14 are arranged, and supports the conveyance unit 16 in a manner that the conveyance unit 16 is rotatable around the vertical axis (Z-axis); a second movable body moving mechanism (not shown) that moves the second movable body 26 in the vertical direction (Z-axis direction); and a conveyance unit rotation mechanism 28 that is attached to the second movable body 26, and rotates the conveyance unit 16 around the vertical axis (Z-axis).

For example, the first movable body 24 is a frame body configured by connecting respective four corners of an upper and lower pair of rectangular frames 24a by four frames 24b extending in the Z-axis direction. A lower part of the first movable body 24 is movably connected to two guide rails 30 arranged parallel to each other and extending in the X-axis direction on a base 34 between the object storage section 12 and the measurement sections 14.

The first movable body moving mechanism is configured using a known moving mechanism such as a ball screw connected to the first movable body 24 and a driving motor rotating the ball screw (none of the parts are shown). By rotating the driving motor in forward and reverse directions, the first movable body 24 (conveyance unit 16) moves along the guide rails 30 in the X-axis direction. The embodiment is not limited to this, as a matter of course, and the first movable body moving mechanism may be a mechanism for allowing the first movable body 24 to run by itself, such as wheels provided in the first movable body 24 and a driving motor for rotating the wheels.

The second movable body 26 is movably connected to two guide rails 32 arranged parallel to each other and extending in the Z-axis direction on the first movable body 24.

The second movable body moving mechanism is configured using a known moving mechanism such as a ball screw connected to the second movable body 26 and a driving motor rotating the ball screw (none of the parts are shown). By rotating the driving motor in forward and reverse directions, the second movable body 26 (conveyance unit 16) moves along the guide rails 32 in the Z-axis direction. The embodiment is not limited to this, as a matter of course, and the second movable body moving mechanism may be a mechanism for allowing the second movable body 26 to run by itself, such as wheels provided in the second movable body 26 and a driving motor for rotating the wheels.

The conveyance unit rotation mechanism 28 is configured using a rotation mechanism such as a rotation shaft (vertical axis) provided in the second movable body 26 and a driving motor 28a that rotates the rotation shaft. An upper face of the conveyance unit 16 is fixed to the rotation shaft (vertical axis). By rotating the driving motor 28a in forward and reverse directions, the conveyance unit 16 rotates by 180 degrees around the vertical axis (Z-axis) so that the opening 16f in the conveyance unit 16 through which the arms 16b and 16c move in and out faces the object storage section 12 or each measurement section 14.

The test head 44 is a device to be maintained (device to be maintained over time) that is used for an inspection of semiconductor elements formed on the wafer, and includes a plurality of terminals (not shown) electrically connected to pogo pins 46b of the pogo frame 46.

The test head 44 is held by a test head holding mechanism.

As illustrated in FIG. 11, the test head holding mechanism includes a base 56, and two test head guide rails 58 extending in the Y-axis direction and fixed on the base 56. The test head 44 is slidably connected to the test head guide rails 58. Also, the test head holding mechanism (base 56) is movably connected to a vertical guide rail (not shown) extending in the Z-axis direction. A lock mechanism (not shown) that locks (fixes) the test head 44 onto the base 56 (and the test head guide rails 58) is provided in the base 56. For example, the lock mechanism is configured of an engaging portion such as a claw portion that is engaged or disengaged with the test head 44.

The test head elevating mechanism 48 is means for elevating and lowering the test head 44. For example, the test head elevating mechanism 48 includes an actuator such as a test head cylinder (air or hydraulic cylinder). For example, the cylinder has one end connected to the base 56 side, and the other end connected to the head stage 20 side. The cylinder may have a brake. By elevating and lowering the test head holding mechanism (base 56) along the vertical guide rail in the Z-axis direction by the actuator, the test head 44 is elevated and lowered in the Z-axis direction together with the test head guide rails 58 in a state where the test head 33 is locked by the lock mechanism, and moves to a pogo pin connecting position P3 (see FIG. 10) or a test head draw-out position P4 (see FIG. 12A).

The pogo pin connecting position P3 is a position where the terminals of the test head 44 and the pogo pins 46b of the pogo frame 46 are electrically connected. The test head draw-out position P4 is a position is determined so as to prevent interference between the test head 44 and the pogo pins 46b (and later-mentioned positioning pin 60a) of the pogo frame 46 when the test head 44 is drawn out (and to secure later-mentioned space for elevating the pogo frame 46).

The test head draw-out mechanism 50 (test head slide mechanism) is means for drawing out the test head 44 elevated to the test head draw-out position P4 to the maintenance area A2 side. For example, the test head draw-out mechanism 50 is configured using the test head guide rails 58.

When the test head 44 is elevated to the test head draw-out position P4, a worker unlocks the lock mechanism and draws the test head 44 to the near side. With this, the test head 44 slides in the Y-axis direction along the test head guide rails 58, and is drawn out to the maintenance area A2 side through the opening 14b (see FIG. 12B). Thus, maintenance (e.g., replacement of a substrate inside the test head and so on) of the test head 44 can be performed.

Upon completion of the maintenance, the test head 44 is slid in the Y-axis direction along the test head guide rails 58 to the test head draw-out position P4 by the worker, and then is lowered to the pogo pin connecting position P3 along the vertical guide rail. At this time, as illustrated in FIG. 10, the test head 44 is placed above the pogo frame 46, that is, in the pogo pin connecting position P3 in a state where the test head 44 is positioned relative to the pogo frame 46 by a test head positioning mechanism 60.

The test head positioning mechanism 60 is means for positioning the test head 44 relative to the pogo frame 46. For example, the test head positioning mechanism 60 includes the positioning pin 60a and recesses 60b on which the positioning pin 60a abuts. The positioning pin 60a may be provided on the pogo frame 46 side, or may be provided on the test head 44 side. If the positioning pin 60a is provided on the pogo frame 46 side, the recess 60b on which the positioning pin 60a abuts is provided on the test head 44 side. Conversely, if the positioning pin 60a is provided on the test head 44 side, the recess 60b on which the positioning pin 60a abuts is provided on the pogo frame 46 side.

The pogo frame 46 is a device to be maintained (device to be maintained over time) that is used for an inspection of a semiconductor element (semiconductor elements) formed on a wafer. As illustrated in FIG. 10, the pogo frame 46 includes a pogo frame main body 46a, and a plurality of pogo pins 46b held on the pogo frame main body 46a. An upper end portion of each pogo pin 46b protrudes from an upper face of the pogo frame main body 46a, while a lower end portion of each pogo pin 46b protrudes from a lower face of the pogo frame main body 46a. The pogo pins 46b are electrically connected to the terminals of the test head 44, and are also electrically connected to the probes of the probe card PC held by the first probe card holding mechanism 36.

The pogo frame 46 is held by a pogo frame holding mechanism.

As illustrated in FIG. 11, the pogo frame holding mechanism includes a base 62, and two pogo frame guide rails 64 extending in the Y-axis direction and fixed on the base 62. The pogo frame 46 is slidably connected to the pogo frame guide rails 64. Also, the pogo frame holding mechanism (base 62) is movably connected to a vertical guide rail (not shown) extending in the Z-axis direction. A lock mechanism (not shown) that locks (fixes) the pogo frame 46 onto the base 62 (and the pogo frame guide rails 64) is provided in the base 62. For example, the lock mechanism includes an engaging part such as a claw part that is engaged or disengaged with the pogo frame 46.

The pogo frame elevating mechanism 52 is means for elevating and lowering the pogo frame 46. For example, the pogo frame elevating mechanism 52 includes an actuator such as a pogo frame cylinder (air or hydraulic cylinder). For example, the cylinder has one end connected to the base 62 side, and the other end connected to the head stage 20 side. The cylinder may have a brake. By elevating and lowering the pogo frame holding mechanism (base 62) along the vertical guide rail in the Z-axis direction by the actuator, the pogo frame 46 is elevated and lowered in the Z-axis direction together with the pogo frame guide rails 64 in a state where the pogo frame 46 is locked by the lock mechanism, and moves to a probe connecting position P5 (see FIG. 12A) or a pogo frame draw-out position P6 (see FIG. 13A).

The probe connecting position P5 is a position where the pogo pins 46b of the pogo frame 46 and the probes (not shown) of the probe card held by the first probe card holding mechanism 36 are electrically connected. The pogo frame draw-out position P6 is a position determined so as to prevent interference between the pogo frame 46 (pogo pins 46b) and the probes (and later-mentioned positioning pin 66a) of the probe card when the pogo frame 46 is drawn out.

The pogo frame draw-out mechanism 54 (pogo frame slide mechanism) is means for drawing out the pogo frame 46 elevated to the pogo frame draw-out position P6 to the maintenance area A2 side. For example, the pogo frame draw-out mechanism 54 includes the pogo frame guide rails 64.

When the pogo frame 46 is elevated to the pogo frame draw-out position P6, a worker unlocks the lock mechanism and draws the pogo frame 46 to the near side. With this, the pogo frame 46 slides in the Y-axis direction along the pogo frame guide rails 64, and is drawn out to the maintenance area A2 side through the opening 14b (see FIG. 13B). Thus, maintenance (e.g., replacement of a pogo pin) of the pogo frame 46 can be performed.

Figure 12A:
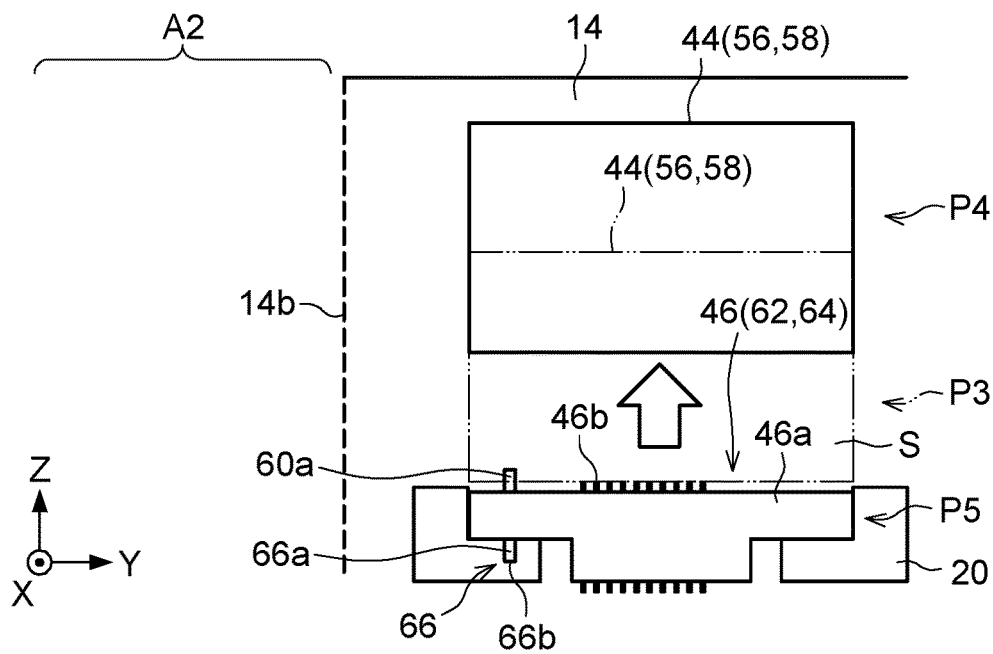
FIG. 12A is a schematic diagram illustrating how the test head is drawn out.

Upon completion of the maintenance, the pogo frame 46 is slid in the Y-axis direction along the pogo frame guide rails 64 to the pogo frame draw-out position P6 by the worker, and then is lowered to the probe connecting position P5 along the vertical guide rail. At this time, as illustrated in FIG. 12A, the pogo frame 46 is placed above the head stage 20, that is, in the probe connecting position P5 in a state where the pogo frame 46 is positioned relative to the head stage 20 by a pogo frame positioning mechanism 66.

The pogo frame positioning mechanism 66 is means for positioning the pogo frame 46 relative to the head stage 20. For example, the pogo frame positioning mechanism 66 is configured of the positioning pin 66a and recesses 66b on which the positioning pin 66a abuts. The positioning pin 66a may be provided on the pogo frame 46 side, or may be provided on the head stage 20 side. If the positioning pin 66a is provided on the pogo frame 46 side, the recess 66b on which the positioning pin 66a abuts is provided on the head stage 20 side. Conversely, if the positioning pin 66a is provided on the head stage 20 side, the recess 66b on which the positioning pin 66a abuts is provided on the pogo frame 46 side.

Note that the devices and mechanisms such as the alignment device 38, the arm moving mechanism, the environment control means 16d, the moving device 22 (first movable body moving mechanism, second movable body moving mechanism, conveyance unit rotation mechanism 28), the test head elevating mechanism 48, and the pogo frame elevating mechanism 52 are driven by being controlled by unillustrated control means (e.g., controller).

Next, an operation example of the conveyance unit 16 of the prober 10 of the embodiment will be described.

<Wafer Conveyance Operation Example>

First, a description will be given about an operation example where the conveyance unit 16 conveys the wafer W from the wafer storage section 12a into the measurement section 14 where an inspection (e.g., high temperature test or low temperature test) is performed.

First, the conveyance unit 16 is moved to a position (position where wafer W can be taken out) where the wafer storage section 12a is accessible, and the conveyance unit 16 is rotated by 180 degrees, so that the opening 16f in the conveyance unit 16 that allows entry of the arms 16b and 16c faces the wafer storage section 12a.

Next, the wafer holding arm 16b advances into the wafer storage section 12a to take out one wafer W from the wafer storage section 12a, and stores the wafer W in the case 16a. At this time, the environment inside the case 16a is adjusted so as to correspond to the environment of the destination measurement section 14. Specifically, gas having a temperature adjusted by the temperature-adjusted gas supply source is supplied into the case 16a, and is also injected from the air injection ports to form an air curtain that closes the opening 16f formed in the case 16a. This seals or substantially seals the space inside the case 16a.

Next, the conveyance unit 16 is moved to a position (position where wafer W can be delivered) accessible to the destination measurement section 14, and the conveyance unit 16 is rotated by 180 degrees, so that the opening 16f formed in the conveyance unit 16, through which the arms 16b and 16c move in and out, faces the destination measurement section 14.

Figure 14:
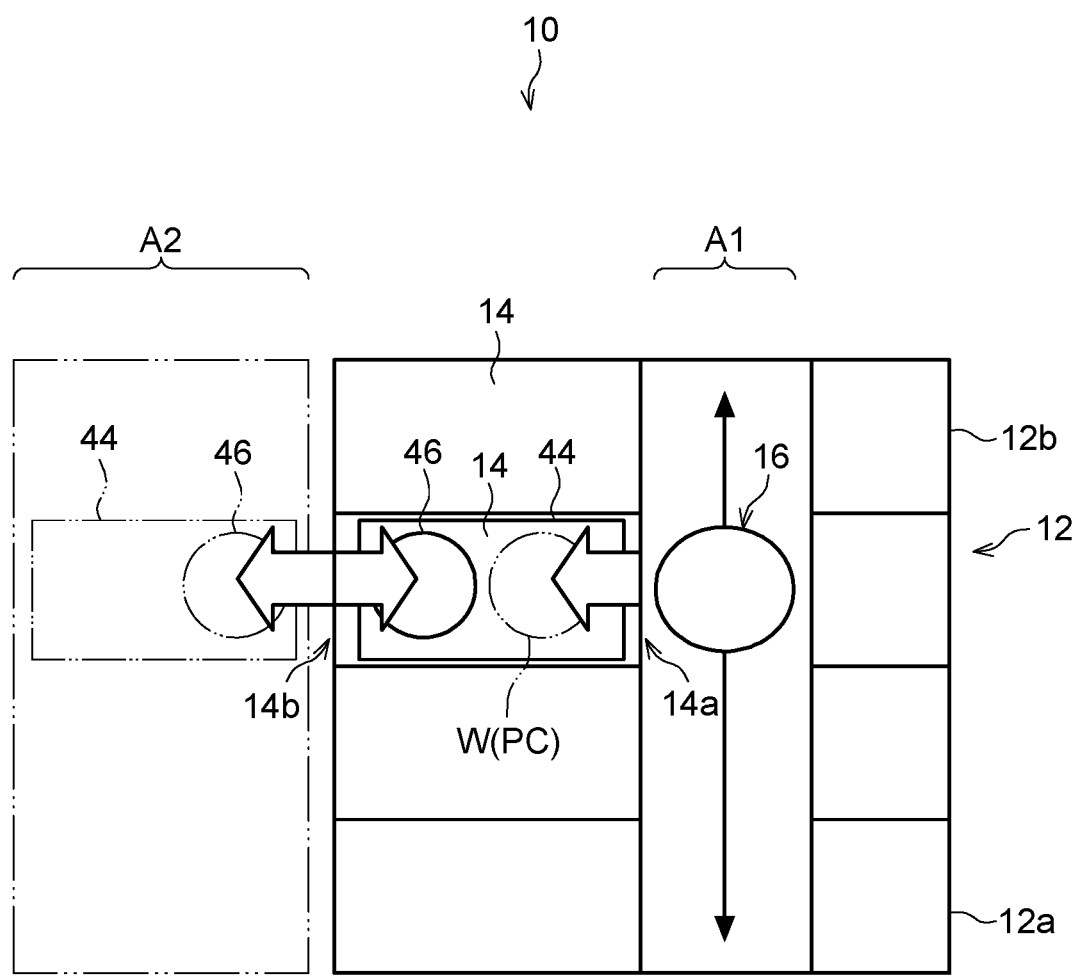
FIG. 14 is a top view illustrating that a draw-out direction of a device to be maintained and a conveyance direction of an object to be conveyed are on a straight line.

Next, the wafer holding arm 16b advances into the measurement section 14 in the Y-axis direction, through the opening 16f on the conveyance unit 16 side where the air curtain is formed and the opening 14a on the measurement section 14 side, to load the wafer W into the wafer chuck 18. The arrow on the right side in FIG. 14 indicates the conveyance direction of the object to be conveyed (wafer W in the example). In a state where the wafer holding arm 16b holds the wafer W, the wafer holding arm 16b passes through the opening 16f closed by the air curtain, and advances into the measurement section 14.

The loaded wafer W is held by the wafer chuck 18 with vacuum contact. Then, the wafer chuck 18 waits for the temperature of the wafer W to be adjusted to an inspection temperature by the wafer chuck 18. When the temperature of the wafer W reaches the inspection temperature, the alignment device 38, while moving in X-Y-Z-θ directions, aligns the wafer W held by the wafer chuck 18 with the probes of the probe card PC held above the wafer chuck 18 by a known method. Then, the wafer chuck 18 moves in the Z-axis direction by an action of the alignment device 38, and brings the wafer W and the probes into electrical contact. Thus, the electric characteristics of the wafer W is inspected through the pogo frame 46 (pogo pins 46b) and the test head 44.

As has been described, the time taken to convey the wafer from the wafer storage section 12a into the destination measurement section 14 is utilized to adjust the environment inside the conveyance unit 16 so as to reduce the difference from the inspection temperature in the destination measurement section 14. Hence, as compared to the conventional technique, the wait time for bringing the temperature of the wafer closer to the inspection temperature in the destination measurement section 14 can be made shorter (or can be eliminated). Accordingly, throughput (capacity per unit time) in the measurement section 14 can be improved.

<Probe Card Conveyance Operation Example>

Next, a description will be given about an operation example when the conveyance unit 16 conveys the probe card PC from the probe card storage section 12b into the measurement section 14 where an inspection (e.g., high temperature test or low temperature test) is performed.

First, the conveyance unit 16 is moved to a position (position where probe card PC can be taken out) accessible to the probe card storage section 12b, and the conveyance unit 16 is rotated by 180 degrees, so that the opening 16f in the conveyance unit 16, through which the arms 16b and 16c move in and out, faces the probe card storage section 12b.

Next, the probe card holding arm 16c advances into the probe card storage section 12b to take out one probe card PC from the probe card storage section 12b, and stores the probe card PC in the case 16a. In addition, the environment inside the case 16a is adjusted so as to correspond to the environment of the destination measurement section 14. Specifically, gas having a temperature adjusted by the temperature-adjusted gas supply source is supplied into the case 16a, and is also injected from the air injection ports to form an air curtain that closes the opening 16f formed in the case 16a. This seals or substantially seals the space inside the case 16a.

Next, the conveyance unit 16 is moved to a position (position where probe card PC can be delivered) accessible to the destination measurement section 14, and the conveyance unit 16 is rotated by 180 degrees so that the opening 16f in the conveyance unit 16, through which the arms 16b and 16c moves in and out, faces the destination measurement section 14.

Figure 7A:
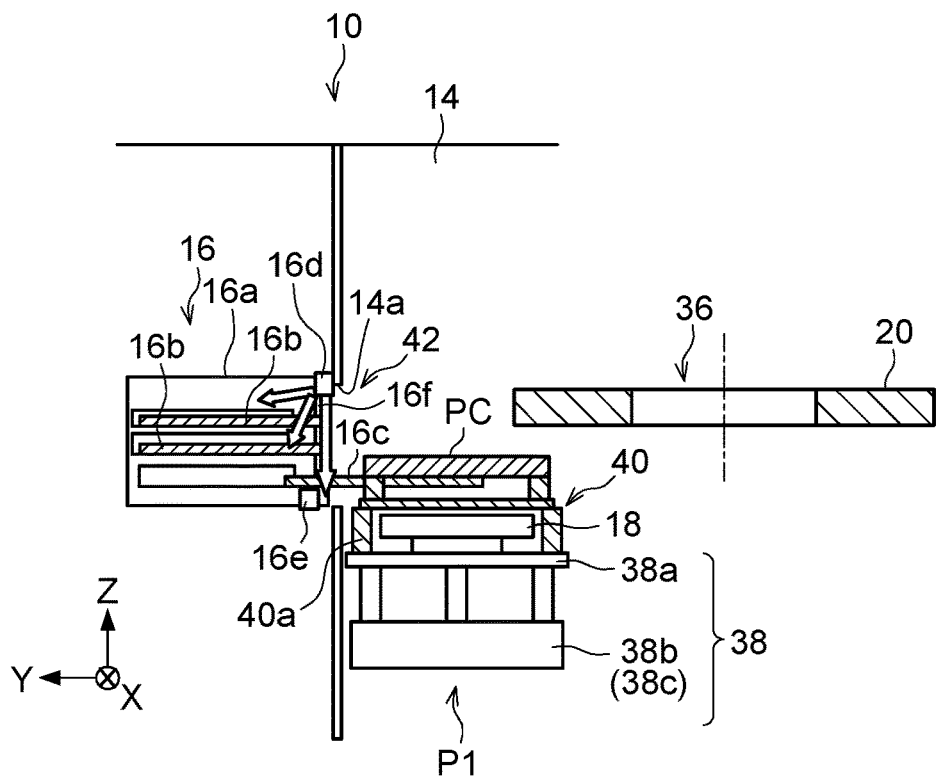
FIG. 7A is a longitudinal section illustrating a schematic configuration of the conveyance unit and the measurement section.

Next, the probe card holding arm 16c advances into the measurement section 14 in the Y-axis direction through the opening 16f on the conveyance unit 16 side where the air curtain is formed and the opening 14a on the measurement section 14 side (see FIG. 7A). In a state where the probe card holding arm 16c holds the probe card PC, the probe card holding arm 16c passes through the opening 16f closed by the air curtain, and advances into the measurement section 14 in the Y-axis direction. The arrow on the right side in FIG. 14 indicates the conveyance direction of the object to be conveyed (probe card PC, in the example in FIGS. 7A and 7B).

Next, the holding portion 40a of the second probe card holding mechanism 40 receives the probe card PC from the probe card holding arm 16c, and holds the probe card PC. Specifically, in a state where the alignment device 38 which is holding the wafer chuck 18 is moved to the probe card receiving position P1, the holding portion 40a is elevated relative to the Z-axis movable portion 38a in the Z-axis direction to be brought into contact with the probe card PC (circumference of the lower face of the probe card PC). Thus, the holding portion 40a elevated in the Z-axis direction lifts the probe card PC from the probe card holding arm 16c. Thereby, the probe card PC is delivered to the holding portion 40a, and is held directly above the wafer chuck 18 by the holding portion 40a.

Figure 7B:
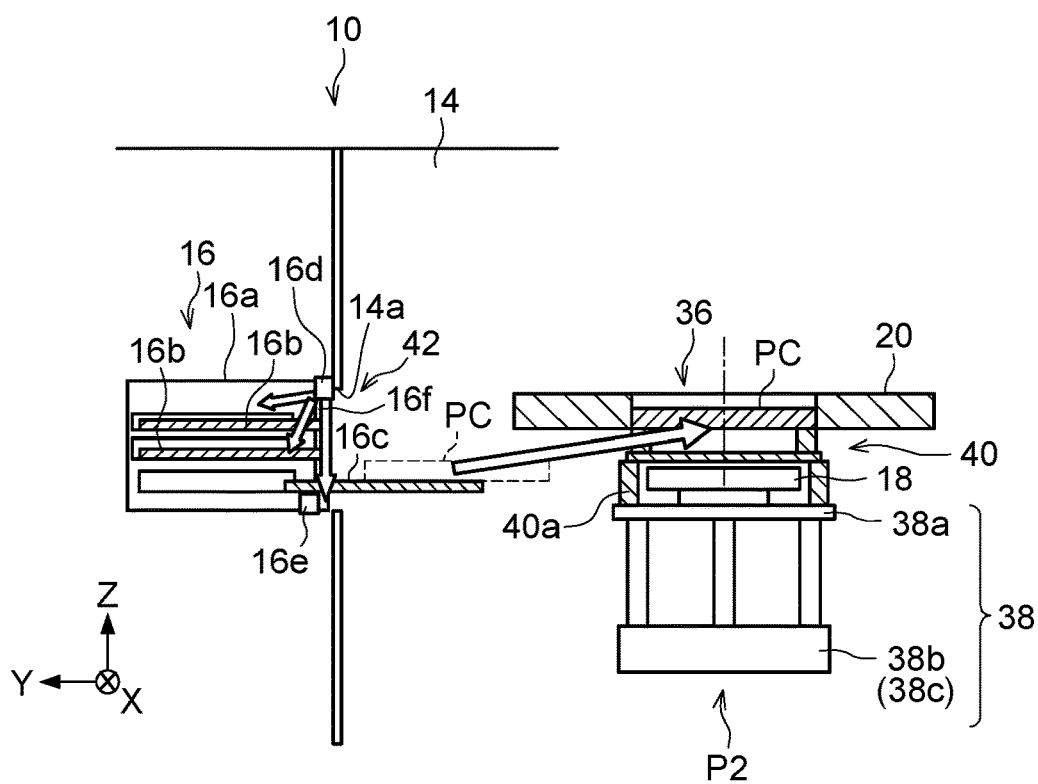
FIG. 7B is a longitudinal section illustrating a schematic configuration of the conveyance unit and the measurement section.

Next, in a state where the alignment device 38 is holding the probe card PC and the wafer chuck 18, the alignment device 38 is moved to the position P2 (see FIG. 7B).

Next, the probe card PC is conveyed to the first probe card holding mechanism 36 (see FIG. 7B). Specifically, in a state where the alignment device 38 holding the wafer chuck 18 is moved to the position P2, the Z-axis movable portion 38a (second probe card holding mechanism 40) is elevated in the Z-axis direction, thereby conveying the probe card PC held by the second probe card holding mechanism 40 to the first probe card holding mechanism 36. The probe card PC conveyed to the first probe card holding mechanism 36 is detachably held by the first probe card holding mechanism 36.

<Test Head Draw-Out Operation Example>

Next, a description will be given about an operation example where the test head 44 is drawn out to the maintenance area A2 side.

First, as illustrated in FIG. 12A, the test head holding mechanism (base 56) is elevated from the pogo pin connecting position P3 to the test head draw-out position P4 by the test head elevating mechanism 48. With this, in a state where the test head 44 is locked by the lock mechanism, the test head 44 moves to the test head draw-out position P4, together with the test head guide rails 58 fixed to the base 56.

Figure 12B:
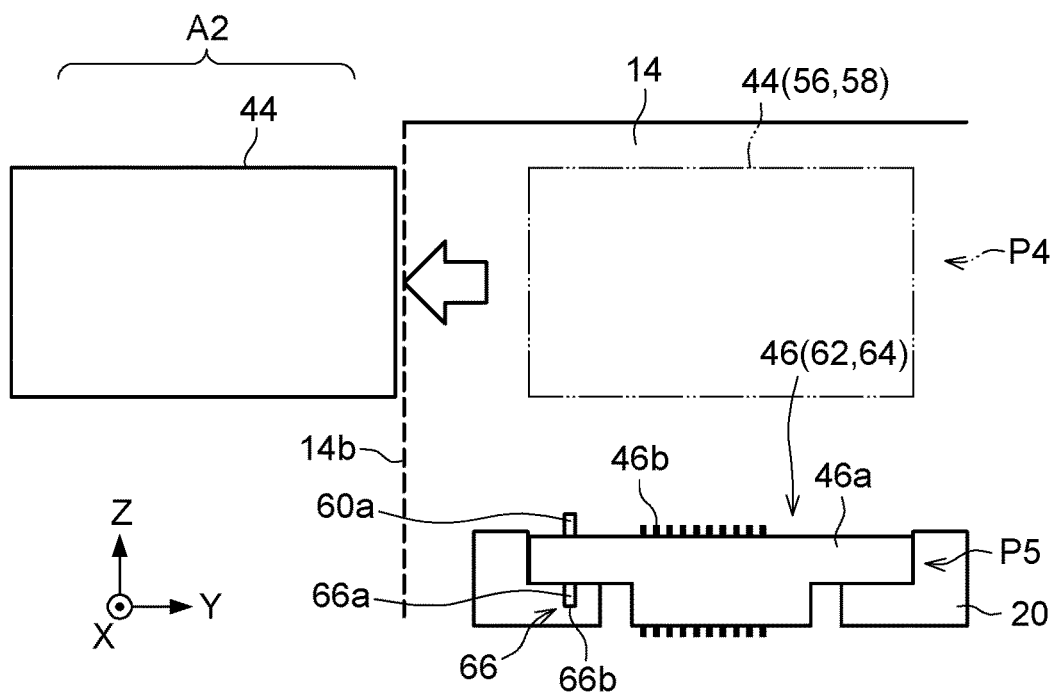
FIG. 12B is a schematic diagram illustrating how the test head is drawn out.

Next, after a worker releases the lock mechanism, the worker draws the test head 44 elevated to the test head draw-out position P4 to the near side. With this, as illustrated in FIG. 12B, the test head 44 slides in the Y-axis direction along the test head guide rails 58, and is drawn out to the maintenance area A2 side through the opening 14b. Thus, maintenance (e.g., replacement of a substrate inside the test head) of the test head 44 can be performed. The arrow on the left side in FIG. 14 indicates the draw-out direction (and push-in direction) of the device to be maintained (test head 44, in the example in FIG. 14).

Next, a description will be given about an operation example where the test head 4 after completion of maintenance is returned to the pogo pin connecting position P3.

First, the worker pushes in the test head 44 after the completion of maintenance along the test head guide rails 58 and slides the test head 44 in the Y-axis direction to the test head draw-out position P4. In this position, the lock mechanism locks the test head 44.

Next, the test head holding mechanism (base 56) is lowered from the test head draw-out position P4 to the pogo pin connecting position P3 by the test head elevating mechanism 48. With this, the test head 44 moves to the pogo pin connecting position P3 together with the test head guide rails 58 fixed to the base 56, in a state whether the test head 44 is locked by the lock mechanism. At this time, as illustrated in FIG. 10, the test head 44 is placed above the pogo frame 46, that is, in the pogo pin connecting position P3, in a state where the test head 44 is positioned relative to the pogo frame 46 by the test head positioning mechanism 60. Thus, the terminals of the test head 44 are aligned with the pogo pins 46*b* of the pogo frame 46, whereby both the terminals and the pogo pins 46*b* can be electrically connected with high accuracy.

As has been described, the draw-out direction (see the arrow on the left side in FIG. 14) of the device to be maintained (test head 44 in the example) and the conveyance direction (see the arrow on the right side in FIG. 14) of the object to be conveyed (wafer W or probe card PC) are on one straight line (same straight line), (linearly) in the Y-axis direction. Hence, Abbe error that needs to be considered, in positioning of the test head 44 relative to the pogo frame 46 which requires high accuracy, can be suppressed (or eliminated). In particular, when returning the test head 44 after the completion of maintenance to the pogo pin connecting position P3, deterioration in positioning accuracy in the X-axis direction can be suppressed.

<Pogo Frame Draw-Out Operation Example>

Next, a description will be given about an operation example where the pogo frame 46 is drawn out to the maintenance area A2 side.

First, as illustrated in FIG. 12A, the test head holding mechanism (base 56) is elevated from the pogo pin connecting position P3 to the test head draw-out position P4 by the test head elevating mechanism 48. With this, the test head 44 moves to the test head draw-out position P4 with the test head guide rails 58 fixed to the base 56, in a state where the test head 44 is locked by the lock mechanism. This secures a space S for elevation of the pogo frame 46.

Figure 13A:
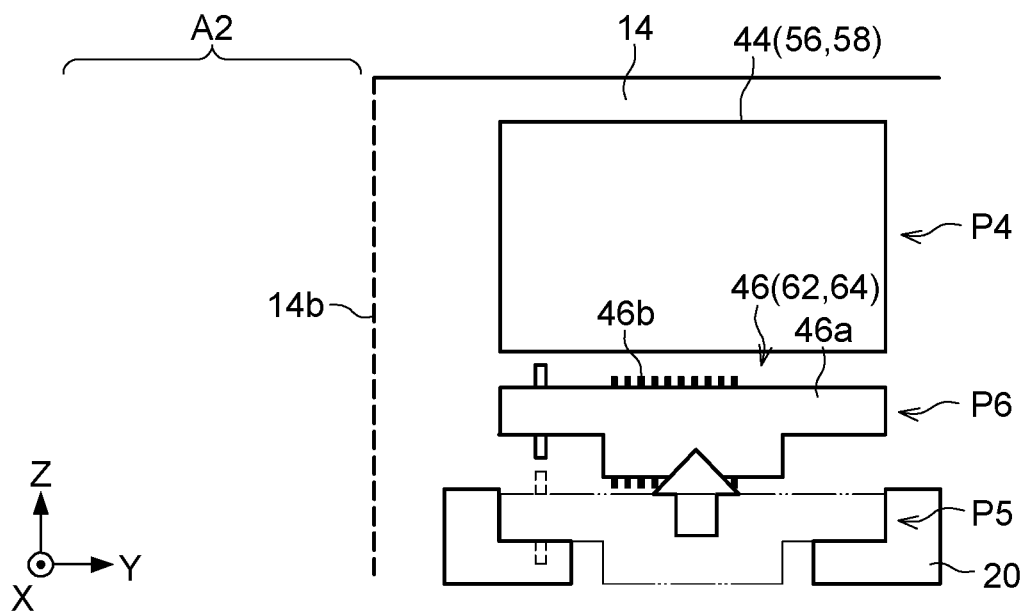
FIG. 13A is a schematic diagram illustrating how the pogo frame is drawn out.

Next, as illustrated in FIG. 13A, the pogo frame holding mechanism (base 62) is elevated from the probe connecting position P5 to the pogo frame draw-out position P6 by the pogo frame elevating mechanism 52. With this, the pogo frame 46 moves to the pogo frame draw-out position P6 together with the pogo frame guide rails 64 fixed to the base 62, in a state where the pogo frame 46 is locked by the lock mechanism.

Figure 13B:
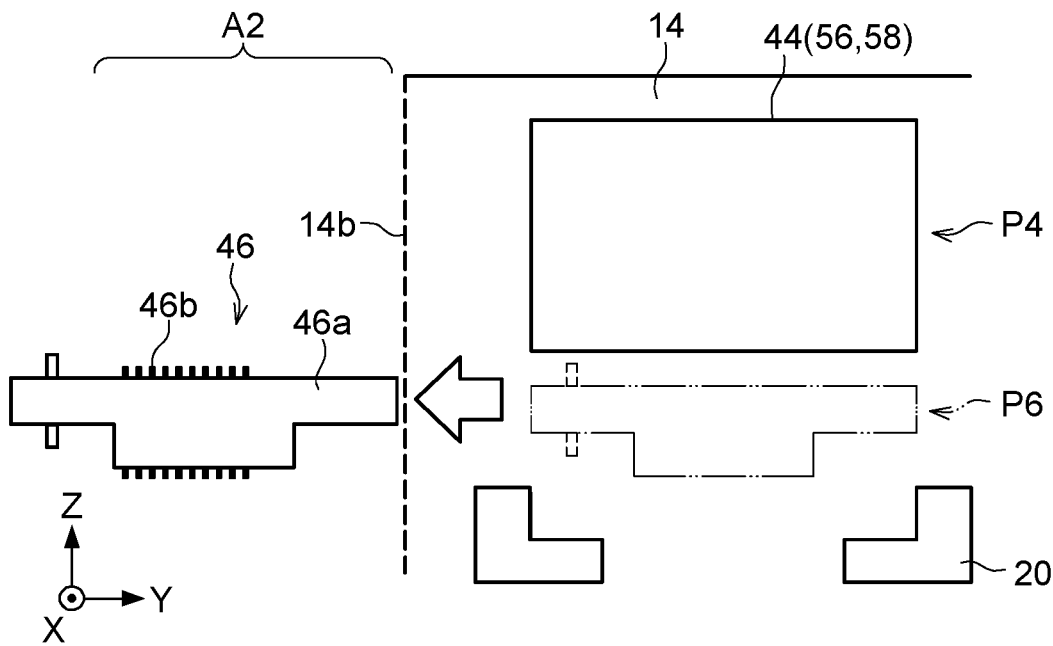
FIG. 13B is a schematic diagram illustrating how the pogo frame is drawn out.

Next, after a worker releases the lock mechanism, the worker draws the pogo frame 46 having been elevated to the pogo frame draw-out position P6, to the near side. With this, as illustrated in FIG. 13B, the pogo frame 46 slides in the Y-axis direction along the pogo frame guide rails 64, and is drawn out to the maintenance area A2 side through the opening 14*b*. Thus, maintenance (e.g., replacement of a pogo pin) of the pogo frame 46 can be performed. The arrow on the left side in FIG. 14 indicates the draw-out direction (and push-in direction) of the device to be maintained (pogo frame 46 in the example).

Next, a description will be given about an operation example where the pogo frame 46 after the completion of maintenance is returned to the probe connecting position P5.

First, the worker pushes in the pogo frame 46 after the completion of maintenance along the pogo frame guide rails 64 and slides the pogo frame 46 in the Y-axis direction to the pogo frame draw-out position P6. In this position, the lock mechanism locks the pogo frame 46.

Next, the pogo frame holding mechanism (base 62) is lowered from the pogo frame draw-out position P6 to the probe connecting position P5 by the pogo frame elevating mechanism 52. With this, the pogo frame 46 moves to the probe connecting position P5 together with the pogo frame guide rails 64 fixed to the base 62, in a state where the pogo frame is locked by the lock mechanism. At this time, as illustrated in FIG. 12A, the pogo frame 46 is placed above the head stage 20, that is, in the probe connecting position P5, in a state where the pogo frame 46 is positioned relative to the head stage 20 by the pogo frame positioning mechanism 66. Thus, the pogo pins 46*b* of the pogo frame 46 are aligned with probes of the probe card, whereby both the pogo pins 46*b* and the probes can be electrically connected with high accuracy.

As has been described, the draw-out direction (see arrow on the left side in FIG. 14) of the device to be maintained (pogo frame 46 in the example) and the conveyance direction (see arrow on the right side in FIG. 14) of the object to be conveyed (wafer W or probe card PC) are (linearly) on one straight line in the Y-axis direction. Hence, Abbe error that needs to be considered in high accuracy positioning of the pogo frame 46 relative to the head stage 20, can be suppressed (or eliminated). In particular, when the pogo frame 46 after the completion of maintenance is returned to the probe connecting position P5, deterioration in positioning accuracy in the X-axis direction can be suppressed.

In addition, since the pogo frame is drawn out without elevating the pogo frame in the conventional technique, the probe card needs to be conveyed out of the measurement section (cell) before drawing out the pogo frame. On the other hand, in the embodiment, the pogo frame 46 is elevated to the pogo frame draw-out position P6 and separated from the probe card, and then the pogo frame 46 elevated to the pogo frame draw-out position P6 is drawn out. Hence, the pogo frame 46 can be drawn out without conveying the probe card PC out of the measurement section 14.

As has been described, according to the embodiment, the prober 10 includes: the plurality of measurement sections 14 each having a device to be maintained (e.g., at least one of test head and pogo frame), and a draw-out mechanism that draws out the device to be maintained; and the conveyance unit 16 that moves to a position accessible to a measurement section as a destination of an object to be conveyed (e.g., at least one of wafer and probe card), and conveys the object to be conveyed into the destination measurement section 14. In the prober 10, the draw-out direction of the device to be maintained and the conveyance direction of the object to be conveyed are linearly on one straight line (see FIG. 14). Hence, Abbe error that needs to be considered in high accuracy positioning of the device to be maintained, can be suppressed (or eliminated).

Specifically, the probe card PC needs to be positioned relative to the pogo frame 46 and the wafer W needs to be positioned relative to the probe card PC in a state where the test head 44 is arranged in the pogo pin connecting position P3 and the pogo frame 46 is arranged in the probe connecting position P5. In the embodiment, because these devices that need to be positioned are linearly moved on one straight line, Abbe error can be suppressed. In addition, since these devices that need to be positioned are linearly moved on one straight line in the embodiment, positioning on the straight line can be omitted, whereby the positioning can be made easier. Additionally, the draw-out direction of the device to be maintained and the conveyance direction of the object to be conveyed are linearly on one straight line in the embodiment. Hence, as compared to a technique where maintenance is performed by rotating a test head and exposing a pogo pin below the test head, a space for rotating the test head can be eliminated to save space.

Additionally, the conventional technique does not include a draw-out mechanism for drawing out a test head, and therefore the conventional devices cannot draw out the test head. On the other hand, since device (prober) according to the embodiment includes the test head elevating mechanism 48 and the test head draw-out mechanism 50, the device of the embodiment can draw out the test head 44.

Next, other modes of loading an object to be conveyed into the measurement section 14 will be described. In the aforementioned example, the object to be conveyed (wafer W or probe card PC) loaded into the measurement section 14 is loaded by the conveyance unit 16 from the conveyance area A1 side (see FIG. 14). However, in another mode of loading of the object into the measurement section 14, the object to be loaded into the measurement section 14 is loaded by a loading part 70 from the maintenance area A2 side.

Figure 15:
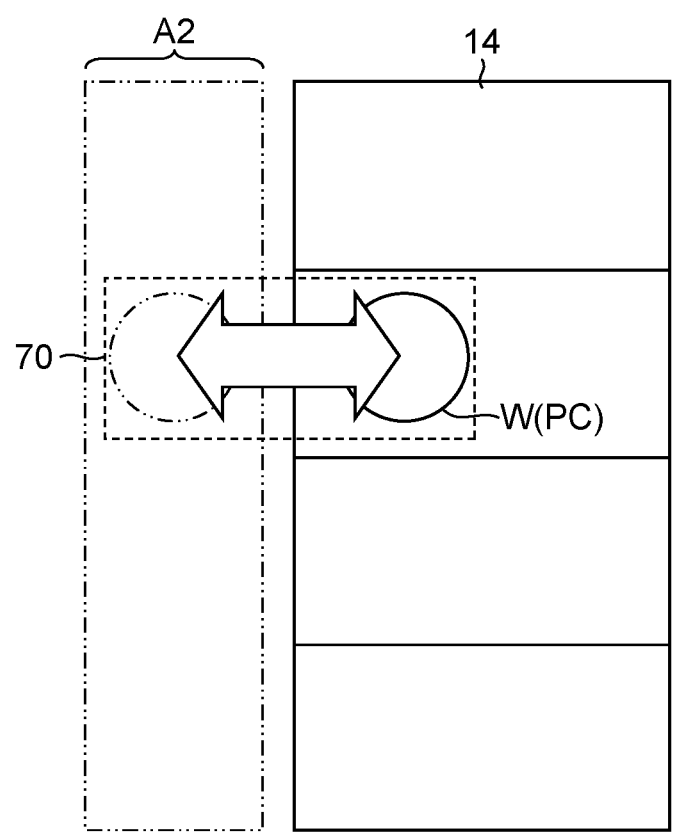
FIG. 15 is a top view illustrating that the object to be conveyed is loaded into the measurement section from the maintenance area side.

FIG. 15 is a top view illustrating that the object to be conveyed (wafer W and probe card PC) is loaded into the measurement section 14 from the maintenance area A2 side. As illustrated in FIG. 15, when the object to be conveyed is loaded into the measurement section 14 from the maintenance area A2 side, the object to be conveyed is loaded into the measurement section 14 by a loading part 70. The loading part 70 may have conveyance means like the aforementioned conveyance unit 16 to convey an object to be conveyed, or a user or an install staff of the prober 10 may manually convey the object to be conveyed to the loading part 70, and then the loading part 70 may load the object to be conveyed into the measurement section 14. The loading part 70 is not particularly limited, and may adopt widely known loading means. For example, the loading part 70 may load the object to be conveyed into the measurement section by a draw-out mechanism, or may load the object to be conveyed into the measurement section by an arm like the conveyance unit 16.

As has been described, the object to be conveyed can be loaded into the measurement section 14 from the conveyance area A1 side and the maintenance area A2 side. For example, when the probe card PC is loaded into the measurement section 14, if the object to be conveyed is one for inspection of semiconductor elements, the conveyance unit 16 loads the object to be conveyed into the measurement section 14, and if the object to be conveyed is one for calibration of the position of the measurement section 14, the loading part 70 loads the object to be conveyed into the measurement section 14.

Also, if the object to be conveyed is loaded into the measurement section 14 frequently, for example, the object to be conveyed is loaded into the measurement section 14 from the conveyance area A1 side, and if the object to be conveyed is loaded into the measurement section 14 less frequently, the object to be conveyed is loaded into the measurement section 14 from the maintenance area side. Here, the frequency varies depending on how the user uses the prober 10. For example, a frequently loaded object to be conveyed is an object that needs to be replaced with every measurement of the wafer W, whereas a less frequently loaded object to be conveyed is an object that needs to be replaced at the time of maintenance or installation (startup) of the prober 10, for example.

Also, for example, if the object to be conveyed requires adjustment of environment, the conveyance unit 16 loads the object to be conveyed into the measurement section 14, and if the object to be conveyed does not require adjustment of environment, the loading part 70 loads the object to be conveyed into the measurement section 14. As described earlier, environment is adjusted by the environment control means 16d of the conveyance unit 16 in the conveyance area A1. Hence, if an object to be conveyed requiring adjustment of temperature or humidity is loaded into the measurement section 14, the object to be conveyed is loaded into the measurement section 14 from the conveyance area A1 side.

Also, for example, whether to load by the conveyance unit 16 or the loading part 70 may be determined according to the type of the object to be conveyed. That is, since various usage and types of wafers W and probe cards PC as objects to be conveyed are used, whether to load by the conveyance unit 16 or the loading part 70 may be determined according to the usage and type of the wafer W and the probe card PC.

For example, the probe card PC includes a measuring probe card for performing inspection measurements of the wafer W, and a calibration probe card for calibrating the position and the like of the wafer W. In this case, the calibration probe card is loaded by the loading part 70 and the measuring probe card is loaded by the conveyance unit 16, for example.

Thus, a more efficient inspection can be performed, by changing the side from which to load the object to be conveyed into the measurement section 14 according to the object to be conveyed and the operation state of the prober 10.

Here, in the present application, loading refers to installation of the probe card PC or the wafer W into the measurement section 14. Also, it is preferable that the loading by the conveyance unit 16 and the loading by the loading part 70 be arranged linearly on a straight line extending in the draw-out direction of the device to be maintained and the conveyance direction of the object to be conveyed. Note that the arrow in FIG. 15 indicates the loading direction of the loading part 70.

Figure 16:
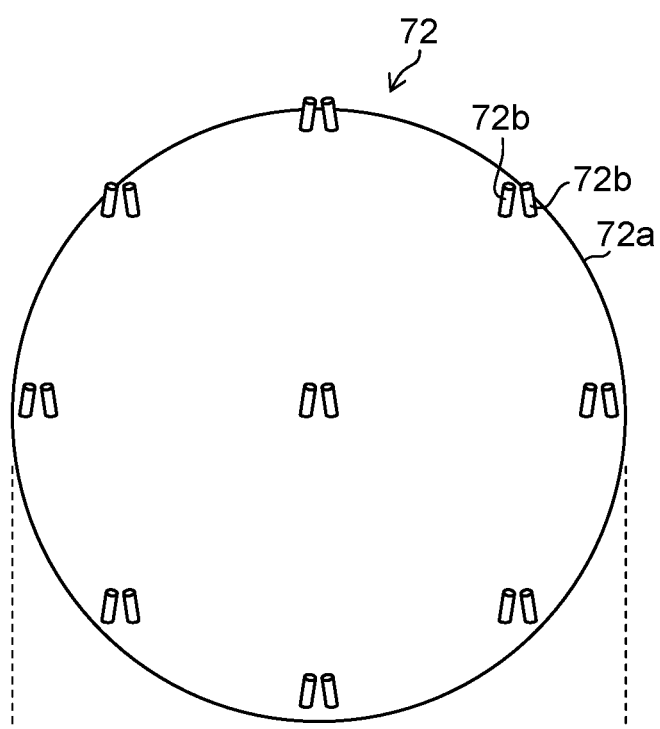
FIG. 16 is a conceptual diagram of an example of a calibration probe card, in which Part (A) is a top view of the calibration probe card and Part (B) is a side view of the calibration probe card.
Figure 16:
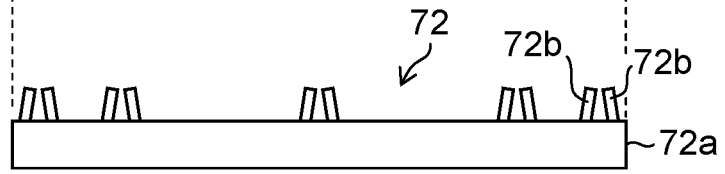

FIG. 16 is a conceptual diagram of an example of a calibration probe card. Part (A) of FIG. 16 is a top view of the probe side of a calibration probe card 72, and part (B) of FIG. 16 is a side view of the calibration probe card 72. The calibration probe card 72 illustrated in FIG. 16 includes a calibration probe card main body 72a, and probes 72b. The calibration probe card 72 has a total of 18 probes 72b. Two probes 72b form a pair (set), and one pair is arranged at the center, while other pairs the probes 72b are arranged at 45 degree-intervals along the outer periphery of the calibration probe card 72. The calibration probe card 72 is used for positioning and alignment of the measurement section 14. Hence, the calibration probe card 72 is used to position the measurement section 14 at the time of startup or installation of the prober 10, for example.

Next, modifications will be described.

The embodiment exemplifies a configuration including the test head elevating mechanism 48, the test head draw-out mechanism 50, the pogo frame elevating mechanism 52, and the pogo frame draw-out mechanism 54. However, the configuration is not limited to this, and a configuration including just the test head elevating mechanism 48 and the test head draw-out mechanism 50 may be used, or a configuration including just the pogo frame elevating mechanism 52 and the pogo frame draw-out mechanism 54 may be used.

Also, the embodiment exemplifies a configuration in which the pogo frame elevating mechanism 52 is used to draw out the elevated pogo frame 46. However, the configuration is not limited to this, and the pogo frame elevating mechanism 52 may be omitted. That is, a pogo frame draw-out mechanism similar to the conventional technique may be used to draw out the pogo frame 46 without elevating the pogo frame 46.

Also, the embodiment exemplifies a configuration in which the arms 16b and 16c of the conveyance unit 16 move in and out through the opening 16f formed in the case 16a. However, the configuration is not limited to this. For example, on a face on the opposite side of where the opening 16f of the case 16a of the conveyance unit 16, an opening (not shown) similar to the opening 16f may be formed so that the arms 16b and 16c may reciprocate individually in the horizontal direction to move in and out through the opening 16f and the opening on the opposite side. With this configuration, the conveyance unit rotation mechanism 28 can be omitted. Then, even though the conveyance unit rotation mechanism 28 is omitted, that is, even without rotating the conveyance unit 16, the arms 16b and 16c can access the object storage section 12 or each measurement section 14. In this case, in addition to the air curtain forming means 42 provided in the case 16a of the conveyance unit 16 to form an air curtain to close the opening 16f, similar air curtain forming means may be provided in the conveyance unit 16 to form an air curtain to close the opening formed on the opposite side of the opening 16f. With this, the space inside the case 16a can be sealed or substantially sealed, and the same effects as in the aforementioned embodiment can be achieved.

Also, the embodiment exemplifies a configuration in which the measurement sections 14 are arranged two dimensionally in the horizontal direction (X-axis direction) and in the vertical direction (Z-axis direction). However, the configuration is not limited to this. A configuration may be adopted where the measurement sections 14 are arranged in only one column in the horizontal direction (X-axis direction), or are arranged in only one column in the vertical direction (Z-axis direction). By arranging the measurement sections 14 in only one row in the horizontal direction (X-axis direction), the second movable body moving mechanism can be omitted. By arranging the measurement sections 14 in only one row in the vertical direction (Z-axis direction), the first movable body moving mechanism can be omitted.

Also, the embodiment exemplifies a configuration including one conveyance unit 16 and one moving device 22. However, the configuration is not limited to this, and a plurality of conveyance units 16 and a plurality of moving devices 22 may be used. With this configuration, throughput in each measurement section 14 can be improved even more.

Also, the embodiment exemplifies a configuration including the wafer holding arm 16b and the probe card holding arm 16c. However, the configuration is not limited to this, and a configuration including just the wafer holding arm 16b may be used, or a configuration including just the probe card holding arm 16c may be used.

Also, the embodiment exemplifies a configuration in which the arms 16b and 16c are provided in the conveyance unit 16. However, the configuration is not limited to this. The respective arms 16b and 16c (or arms corresponding to these) may be provided on the object storage section 12 side and the measurement section 14 side. With this, too, the object to be conveyed can be taken out of the object storage section 12 or the measurement section 14 by each arm to store inside the conveyance unit 16, and the object to be conveyed may be taken out of the conveyance unit 16 to deliver to the object storage section 12 or the measurement section 14.

Also, the embodiment exemplifies a configuration in which the opening 16f formed in the case 16a is closed by an air curtain. However, the configuration is not limited to this. Opening and closing means such as a shutter or door that is opened during take-out or delivering of the object to be conveyed, and is closed during conveyance of the object to be conveyed may be provided in the conveyance unit 16, and the opening and closing means may be configured to open and close the opening 16f. Further, the opening 14a formed in each measurement section 14 may be closed by a similar air curtain, or the opening 14a may be opened and closed by similar opening and closing means.

As has been described, in the prober including: a plurality of measurement sections each having a device to be maintained, and a draw-out mechanism that draws out the device to be maintained; and the conveyance unit that moves to a position accessible to a destination measurement section as a destination of an object to be conveyed, and conveys the object to be conveyed into the destination measurement section, the draw-out direction of the device to be maintained and the conveyance direction of the object to be conveyed are linearly arranged on one straight line to suppress Abbe error that needs to be considered in high accuracy positioning of the device to be maintained. This idea is applicable not only to the prober of the aforementioned embodiment, but also to any type of prober that includes: a plurality of measurement sections each having a device to be maintained, and a draw-out mechanism that draws out the device to be maintained; and a conveyance unit that moves to a position accessible to a destination measurement section as a destination of an object to be conveyed, and conveys the object to be conveyed into the destination measurement section.

Although the prober of the present invention has been described in detail, the invention is not limited to the examples, and various improvements and modifications can be made without departing from the gist of the invention, as a matter of course.

REFERENCE SIGNS LIST

10 . . . prober, 12 . . . object storage section, 12a . . . wafer storage section, 12b . . . probe card storage section, 14 . . . measurement section, 14a . . . opening, 16 . . . conveyance unit, 16a . . . case, 16b . . . wafer holding arm, 16c . . . probe card holding arm, 16d . . . environment control means, 16e sensor, 16f . . . opening, 18 . . . wafer chuck, 20 . . . head stage, 22 . . . moving device, 24 . . . first movable body, 26 . . . second movable body, 28 . . . conveyance unit rotation mechanism, 28 . . . driving motor, 30, 32 . . . guide rail, 34 . . . base, 36 . . . first probe card holding mechanism, 38 . . . alignment device, 40 . . . second probe card holding mechanism, 40a . . . holding portion, 42 . . . air curtain forming means, 44 . . . test head, 46 . . . pogo frame, 46a . . . pogo frame main body, 46b . . . pogo pin, 48 . . . test head elevating mechanism, 50 . . . test head draw-out mechanism, 52 . . . pogo frame elevating mechanism, 54 . . . pogo frame draw-out mechanism, 56 . . . base, 58 . . . test head guide rail, 60 . . . test head positioning mechanism, 60*a* . . . positioning pin, 60*b* . . . recess, 62 . . . base, 64 . . . pogo frame guide rail, 66 . . . pogo frame positioning mechanism, 66*a* . . . positioning pin, 66*b* . . . recess, CH . . . card holder, PC . . . probe card, W . . . wafer

What is claimed is:

1. A prober comprising:
a plurality of measurement sections arranged between a conveyance area and a maintenance area, each of the measurement sections having a device to be maintained which is used for inspection of a semiconductor element formed on a wafer, and a draw-out mechanism configured to draw out the device to be maintained to a side of the maintenance area;
a conveyor configured to convey a probe card to a measurement section being a conveyance destination; and
a loader configured to load the probe card from the side of the maintenance area to the measurement section, wherein
the plurality of measurement sections are configured such that the probe card is loadable from a side of the conveyance area and the side of the maintenance area.

2. The prober according to claim 1, wherein
the conveyor loads the probe card into the measurement section if the probe card is used for inspection of the semiconductor element, and
the loader loads the probe card into the measurement section if the probe card is used for calibration of a position of the measurement section.

3. The prober according to claim 1, wherein
the conveyor loads the probe card if the probe card requires adjustment of environment, and
the loader loads the probe card if the probe card does not require adjustment of environment.

4. The prober according to claim 1, wherein
the probe card that the loader loads into the measurement section is a calibration probe card.

5. The prober according to claim 1, wherein
the probe card that the conveyor loads into the measurement section is a measuring probe card.

6. The prober according to claim 1, wherein
a draw-out direction of the device to be maintained and a conveyance direction of the probe card are arranged on one straight line, and
the device to be maintained is a test head.

7. The prober according to claim 1, wherein
a draw-out direction of the device to be maintained and a conveyance direction of the probe card are arranged on one straight line, and
the device to be maintained is a pogo frame arranged between a test head and the probe card.

8. A prober comprising:
a plurality of measurement sections arranged between a conveyance area and a maintenance area, each of the measurement sections having a device to be maintained which is used for inspection of a semiconductor element formed on a wafer, and a draw-out mechanism configured to draw out the device to be maintained to a side of the maintenance area;
a conveyor configured to convey a wafer to a measurement section being a conveyance destination; and
a loader configured to load the wafer from the side of the maintenance area to the measurement section, wherein
the plurality of measurement sections are configured such that the wafer is loadable from a side of the conveyance area and the side of the maintenance area.

9. The prober according to claim 8, wherein
the conveyor loads the wafer if the wafer requires adjustment of environment, and
the loader loads the wafer if the wafer does not require adjustment of environment.

10. The prober according to claim 8, wherein
a draw-out direction of the device to be maintained and a conveyance direction of the wafer are arranged on one straight line, and
the device to be maintained is a test head.

* * * * *